United States Patent
We et al.

(10) Patent No.: US 11,456,291 B2
(45) Date of Patent: Sep. 27, 2022

(54) INTEGRATED CIRCUIT (IC) PACKAGES EMPLOYING SPLIT, DOUBLE-SIDED METALLIZATION STRUCTURES TO FACILITATE A SEMICONDUCTOR DIE ("DIE") MODULE EMPLOYING STACKED DICE, AND RELATED FABRICATION METHODS

(71) Applicant: QUALCOMM Incorporated, San Diego, CA (US)

(72) Inventors: Hong Bok We, San Diego, CA (US); Marcus Hsu, San Diego, CA (US); Aniket Patil, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/910,486

(22) Filed: Jun. 24, 2020

(65) Prior Publication Data
US 2021/0407979 A1    Dec. 30, 2021

(51) Int. Cl.
| | | |
|---|---|---|
| *H01L 25/18* | (2006.01) | |
| *H01L 23/538* | (2006.01) | |
| *H01L 23/00* | (2006.01) | |
| *H01L 25/00* | (2006.01) | |

(52) U.S. Cl.
CPC .......... *H01L 25/18* (2013.01); *H01L 23/5385* (2013.01); *H01L 24/16* (2013.01);
(Continued)

(58) Field of Classification Search
CPC ......... H01L 25/50; H01L 24/81; H01L 24/16; H01L 2224/32145; H01L 23/5385;
(Continued)

(56) References Cited

U.S. PATENT DOCUMENTS 6,621,172 B2    9/2003   Nakayama et al.
2002/0074652 A1  6/2002   Pierce
(Continued)

FOREIGN PATENT DOCUMENTS

WO    2016007120 A1    1/2016

OTHER PUBLICATIONS

Fukushima T., et al., "Oxide-Oxide Thermocompression Direct Bonding Technologies with Capillary Self-Assembly for Multichip-to-Wafer Heterogeneous 3D System Integration", www.mdpi.com/journal/micromachines, MDPI, Oct. 10, 2016, pp. 1-18.
(Continued)

*Primary Examiner* — Jasmine J Clark
(74) *Attorney, Agent, or Firm* — W&T/Qualcomm

(57) ABSTRACT

Integrated circuit (IC) packages employing split, double-sided IC metallization structures to facilitate a semiconductor die module employing stacked dice, and related fabrication methods are disclosed. Multiple IC dice in the IC package are stacked and bonded together in a back-to-back, top and bottom IC die configuration in an IC die module, which can minimize the height of the IC package. The metallization structure is split between separate top and bottom metallization structures adjacent to respective top and bottom surfaces of the IC die module to facilitate die-to-die and external electrical connections to the dice. The top and bottom metallization structures can be double-sided by exposing substrate interconnects on respective inner and outer surfaces for respective die and external electrical interconnections. In other aspects, a compression bond is included between the IC dice mounted together in a back-to-back configuration to further minimize the overall height of the IC package.

24 Claims, 15 Drawing Sheets

(52) U.S. Cl.
CPC .............. *H01L 24/32* (2013.01); *H01L 24/73* (2013.01); *H01L 24/81* (2013.01); *H01L 24/83* (2013.01); *H01L 24/92* (2013.01); *H01L 25/50* (2013.01); *H01L 2224/16225* (2013.01); *H01L 2224/32145* (2013.01); *H01L 2224/73253* (2013.01); *H01L 2224/8182* (2013.01); *H01L 2224/81203* (2013.01); *H01L 2224/83005* (2013.01); *H01L 2224/83203* (2013.01); *H01L 2224/83896* (2013.01); *H01L 2224/92242* (2013.01); *H01L 2924/20105* (2013.01)

(58) Field of Classification Search
CPC . H01L 2224/81203; H01L 2224/73253; H01L 24/92; H01L 2924/14
See application file for complete search history.

(56) References Cited

U.S. PATENT DOCUMENTS

| | | |
|---|---|---|
| 2009/0001821 A1 | 1/2009 | Walker et al. |
| 2010/0314780 A1* | 12/2010 | Camacho ............ H01L 23/3107 257/777 |
| 2011/0202505 A1 | 8/2011 | Sugahara |
| 2015/0287672 A1 | 10/2015 | Yazdani |
| 2016/0118333 A1 | 4/2016 | Lin |
| 2016/0260695 A1 | 9/2016 | Chung et al. |
| 2017/0084589 A1* | 3/2017 | Kuo ..................... H01L 23/3128 |
| 2018/0366429 A1 | 12/2018 | Chiu et al. |
| 2019/0287924 A1 | 9/2019 | Moon et al. |
| 2021/0280523 A1 | 9/2021 | We |

OTHER PUBLICATIONS

Invitation to Pay Additional Fees and Partial International Search for International Patent Application No. PCT/US2021/033915, dated Sep. 23, 2021, 15 pages.

International Search Report and Written Opinion for International Patent Application No. PCT/US2021/033915, dated Nov. 15, 2021, 22 pages.

\* cited by examiner

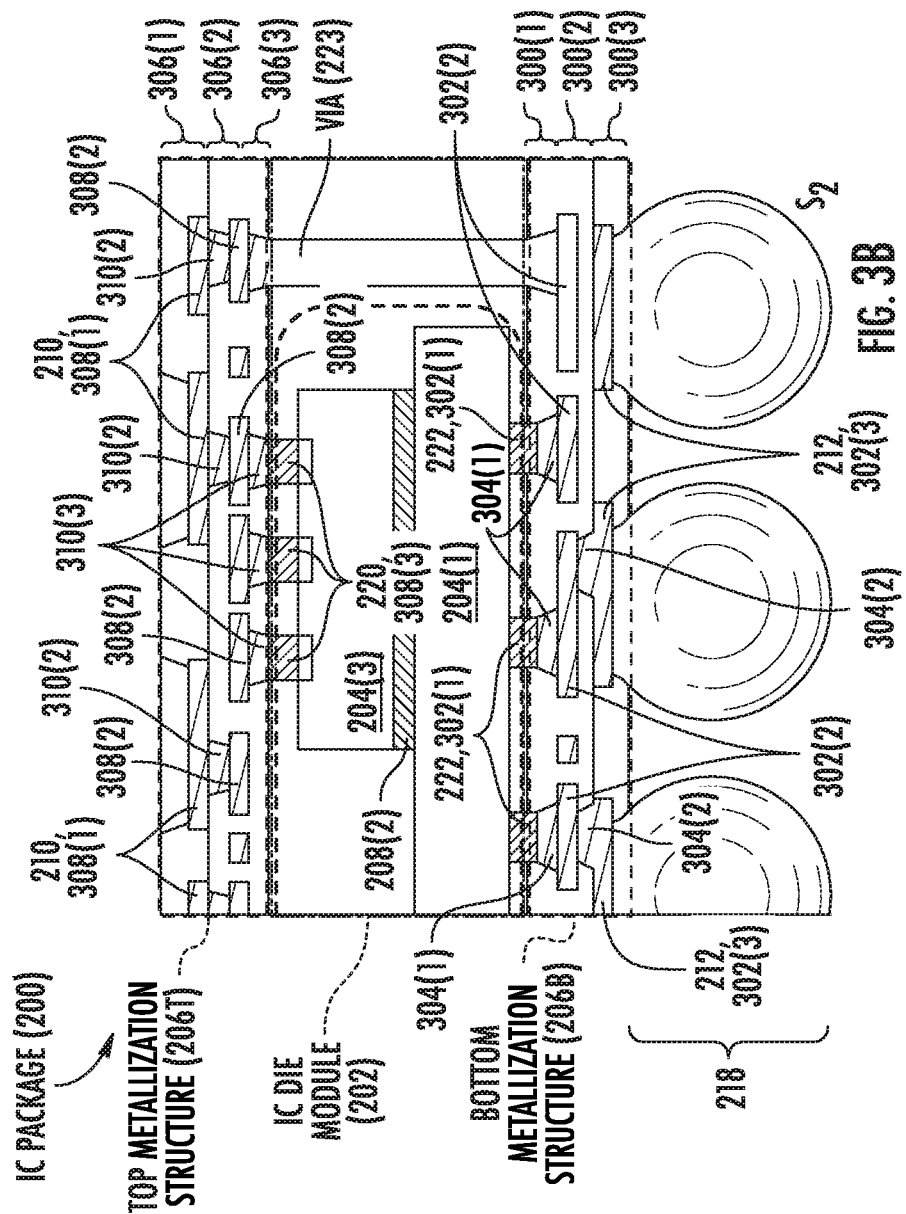

400 ⎯↘

┌─────────────────────────────────────────────────────────────────────────────┐
│ FABRICATE AN IC DIE MODULE (202) DISPOSED BETWEEN THE FIRST METALLIZATION STRUCTURE │ ⎯ 406
│ (206B) AND THE SECOND METALLIZATION STRUCTURE (206T), THE IC DIE MODULE (202) │
│ INCLUDING:                                                                   │
└─────────────────────────────────────────────────────────────────────────────┘

┌─────────────────────────────────────────────────────────────────────────────┐
│ COMPRESSION BONDING A FIRST TOP SURFACE (211(1)) OF A FIRST IC DIE (204(1)) AND │ ⎯ 406(1)
│ A SECOND TOP SURFACE (211(2)) OF A SECOND IC DIE (204(2)), THE FIRST IC DIE │
│ (204(1)) INCLUDING A FIRST BOTTOM SURFACE (213(1)) INCLUDING AN ACTIVE FACE │
│ SURFACE, ONE OR MORE FIRST DIE INTERCONNECTS (228(1)) EXPOSED THROUGH THE │
│ FIRST BOTTOM SURFACE (213(1)), AND THE FIRST TOP SURFACE (211(1)) INCLUDING │
│ A NON-ACTIVE SURFACE, AND THE SECOND IC DIE (204(2)) INCLUDING A SECOND BOTTOM │
│ SURFACE (213(2)) INCLUDING AN ACTIVE FACE SURFACE, ONE OR MORE SECOND DIE │
│ INTERCONNECTS (228(2)) EXPOSED THROUGH THE SECOND BOTTOM SURFACE (213(2)), │
│ AND THE SECOND TOP SURFACE (211(2)) INCLUDING A NON-ACTIVE SURFACE │
└─────────────────────────────────────────────────────────────────────────────┘

┌─────────────────────────────────────────────────────────────────────────────┐
│ ELECTRICALLY COUPLING AT LEAST ONE OF THE ONE OR MORE FIRST DIE INTERCONNECTS │ ⎯ 406(2)
│ (228(1)) OF THE FIRST IC DIE (204(1)) TO AT LEAST ONE OF THE ONE OR MORE FIRST │
│ TOP SUBSTRATE INTERCONNECTS (222) OF THE FIRST METALLIZATION STRUCTURE (206B) │
└─────────────────────────────────────────────────────────────────────────────┘

┌─────────────────────────────────────────────────────────────────────────────┐
│ ELECTRICALLY COUPLING AT LEAST ONE OF THE ONE OR MORE SECOND DIE │ ⎯ 406(3)
│ INTERCONNECTS (228(2)) OF THE SECOND IC DIE (204(2)) TO AT LEAST ONE OF THE │
│ ONE OR MORE SECOND BOTTOM SUBSTRATE INTERCONNECTS (220) OF THE SECOND │
│ METALLIZATION STRUCTURE (206T) │
└─────────────────────────────────────────────────────────────────────────────┘

FIG. 4B

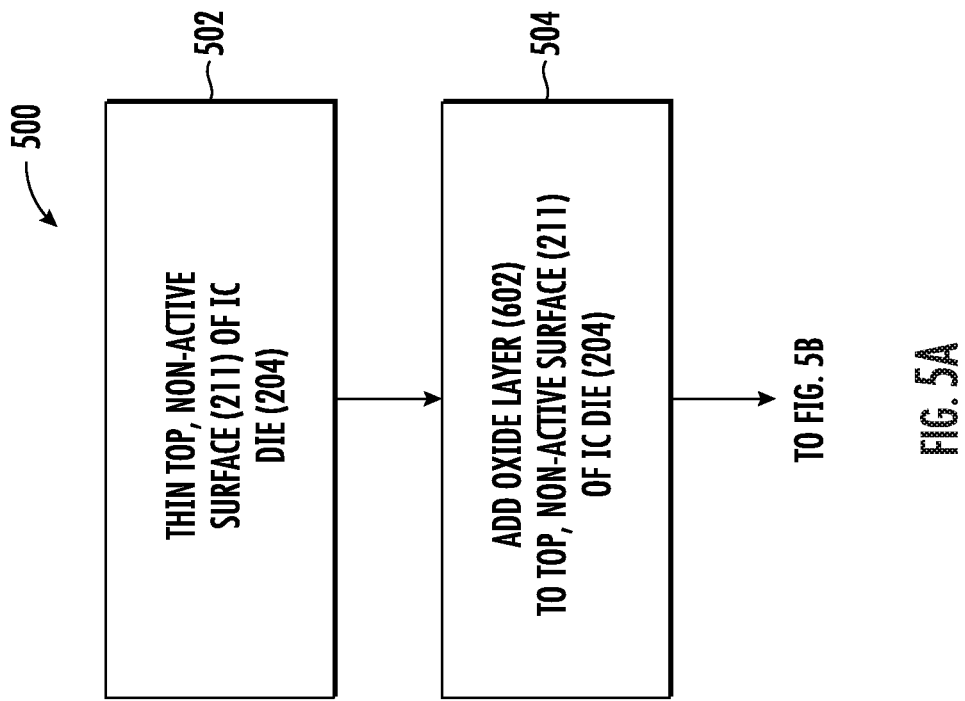
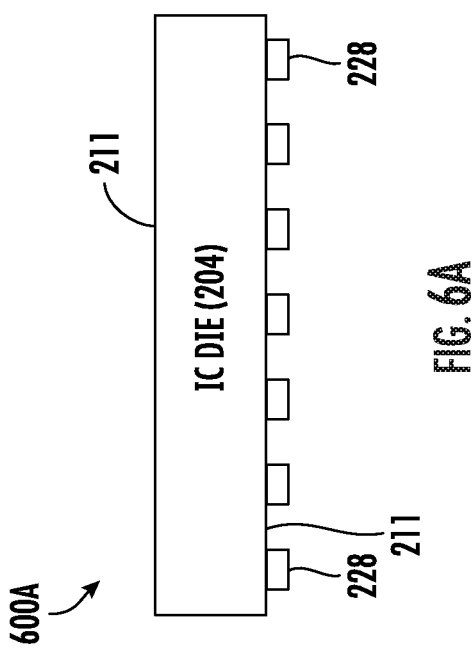
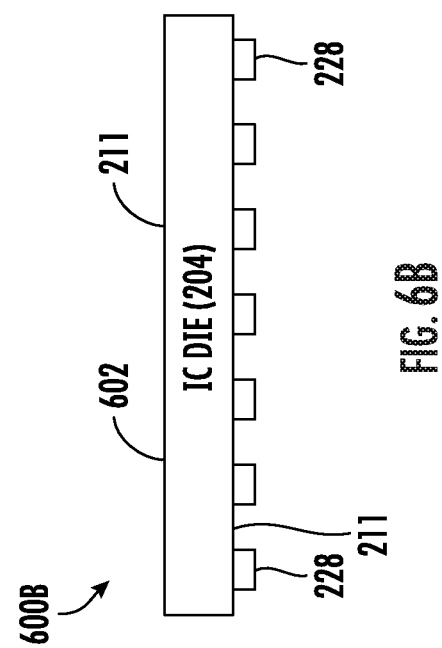

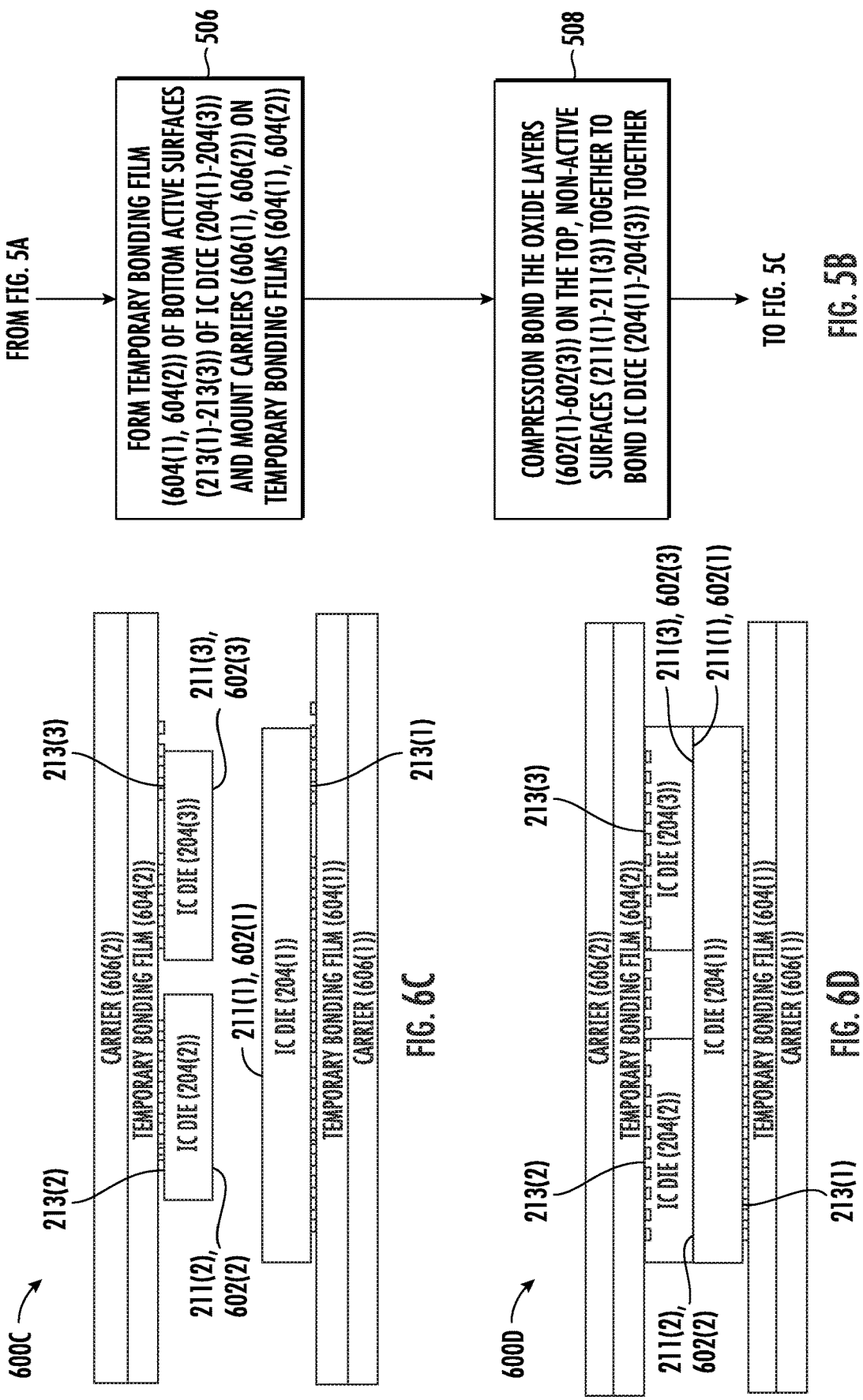

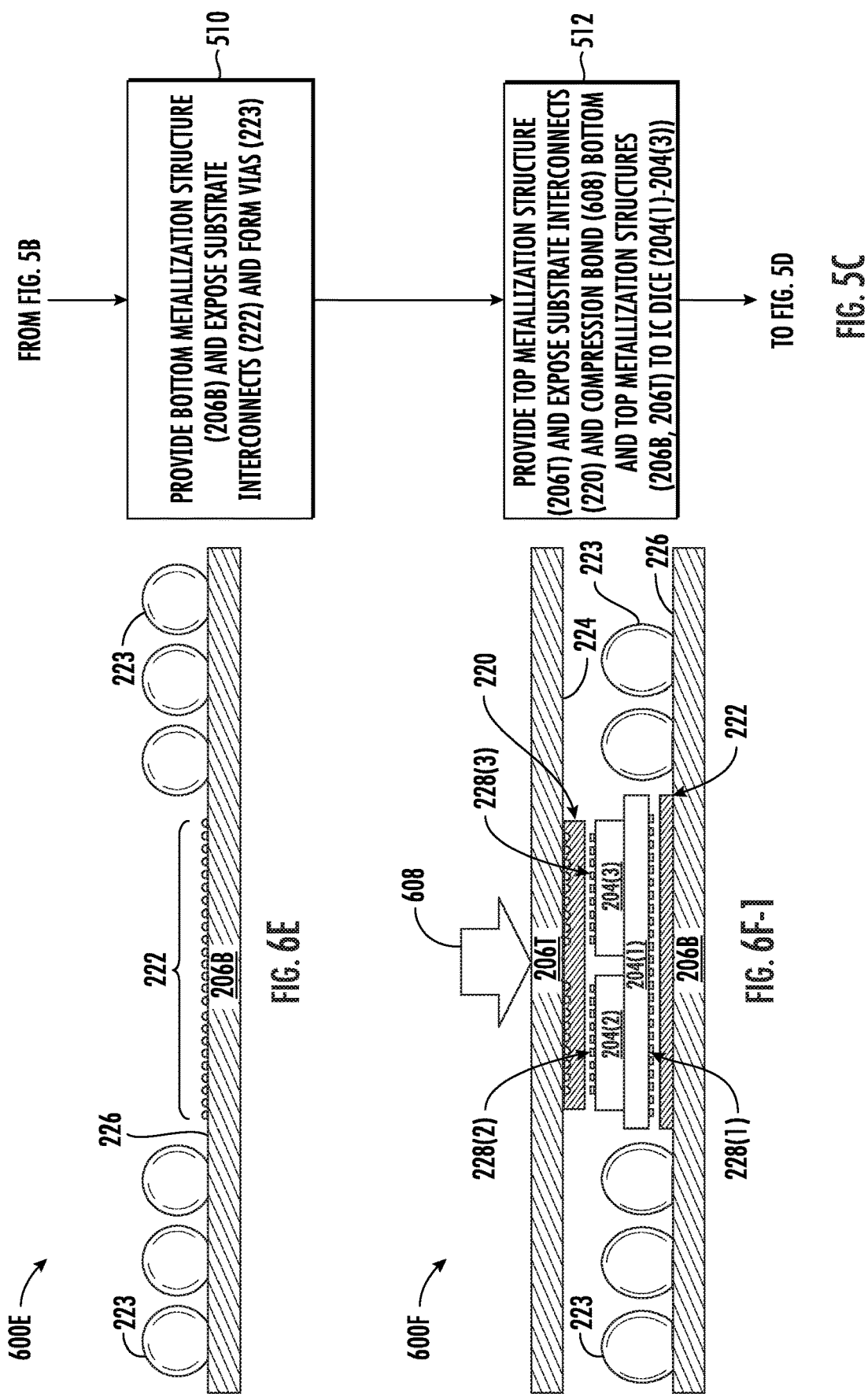

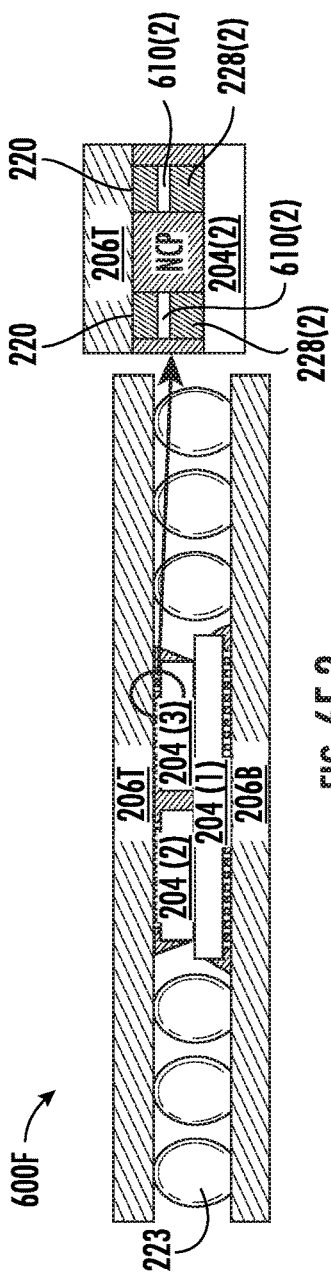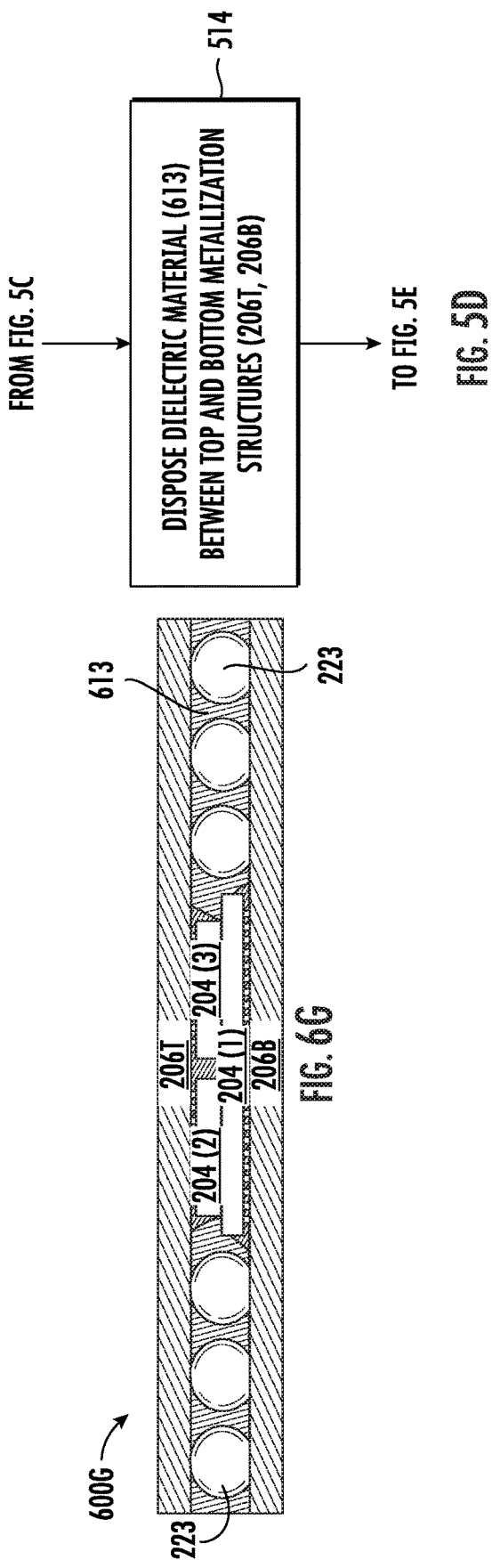

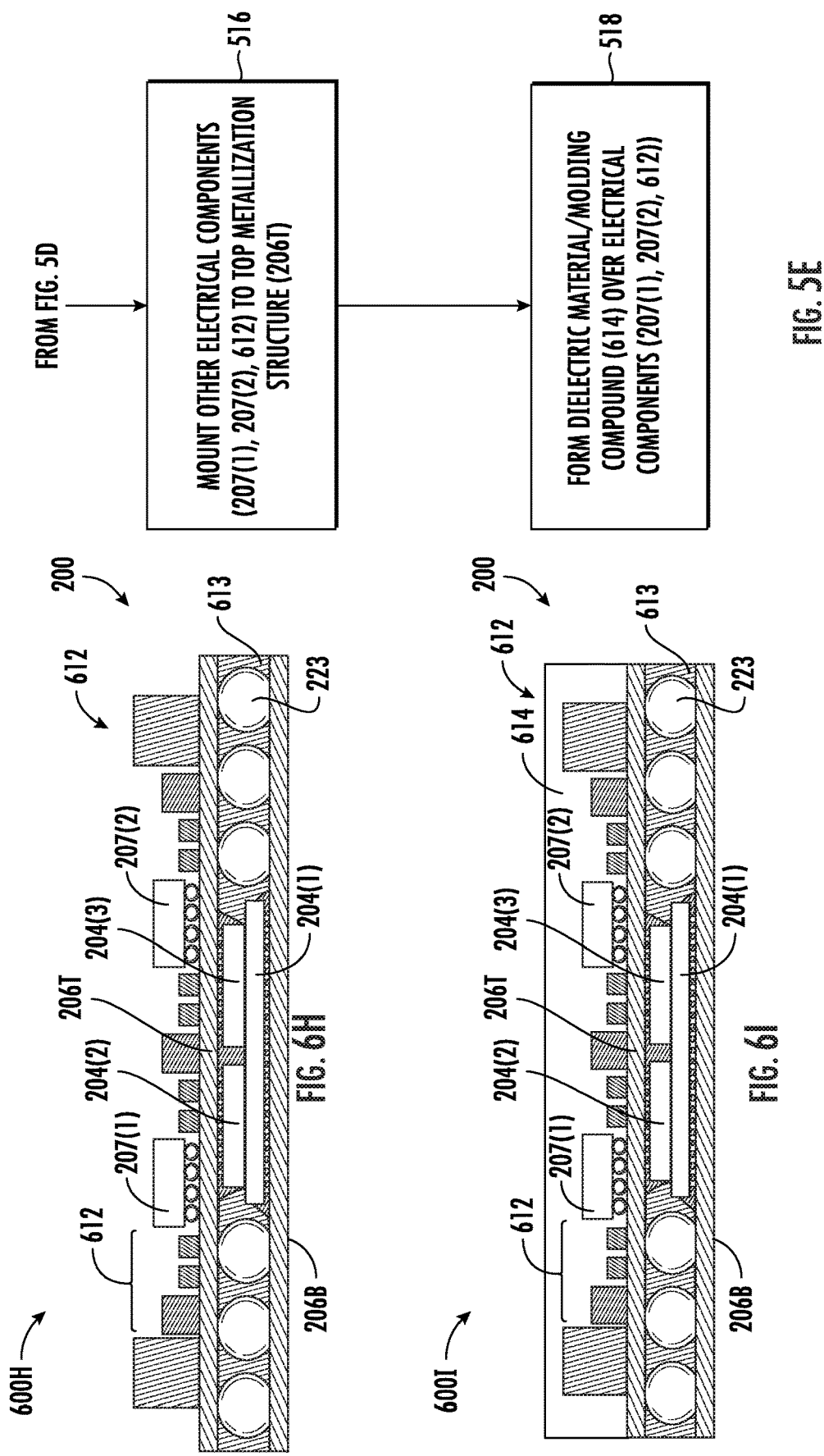

INTEGRATED CIRCUIT (IC) PACKAGES EMPLOYING SPLIT, DOUBLE-SIDED METALLIZATION STRUCTURES TO FACILITATE A SEMICONDUCTOR DIE ("DIE") MODULE EMPLOYING STACKED DICE, AND RELATED FABRICATION METHODS

BACKGROUND

I. Field of the Disclosure

The field of the disclosure relates to integrated circuit (IC) packages that include one or more semiconductor dice attached to a package structure that provides an electrical interface to the semiconductor dice.

II. Background

Integrated circuits (ICs) are the cornerstone of electronic devices. ICs are packaged in an IC package, also called a "semiconductor package" or "chip package." The IC package includes one or more semiconductor dice as an IC(s) that are mounted on and electrically coupled to a package substrate to provide physical support and an electrical interface to the semiconductor die(s). The package substrate may be an embedded trace substrate (ETS), for example, that includes embedded electrical traces in one or more dielectric layers and vertical interconnect accesses (vias) coupling the electrical traces together to provide electrical interfaces between the semiconductor die(s). The semiconductor die(s) is mounted to and electrically interfaced to interconnects exposed in a top layer of the package substrate to electrically couple the semiconductor die(s) to the electrical traces of the package substrate.

The semiconductor die(s) and package substrate are encapsulated in a package material, such as a molding compound, to form the IC package. The IC package may also include external solder balls in a ball grid array (BGA) that are electrically coupled to interconnects exposed in a bottom layer of the package substrate to electrically couple the solder balls to the electrical traces in the package substrate. The solder balls provide an external electrical interface to the semiconductor die(s) in the IC package. The solder balls are electrically coupled to metal contacts on a printed circuit board (PCB) when the IC package is mounted to the PCB to provide an electrical interface between electrical traces in the PCB to the IC chip through the package substrate in the IC package.

SUMMARY OF THE DISCLOSURE

Aspects disclosed herein include integrated circuit (IC) packages employing split, double-sided metallization structures to facilitate a semiconductor die module employing stacked dice. Related chip packages and methods of fabricating the IC package are also disclosed. The IC package includes multiple semiconductor dice (also referred to as "IC dice") mounted on a metallization structure to provide interconnections to the IC dice. In exemplary aspects, to facilitate shrinking the overall height of the IC package to conserve area, the multiple IC dice in the IC package are stacked and bonded together in a back-to-back, top and bottom IC die configuration in an IC die module in the IC package. Then, to facilitate die-to-die and external electrical connections to the IC dice stacked in the back-to-back configuration, a metallization structure of the IC package is split between separate top and bottom metallization structures adjacent to respective top and bottom surfaces of the IC die module. The active surfaces of the IC die are mounted and electrically connected to their respective top and bottom metallization structures that include one or more routing layers of electrical traces for routing of electrical signals between the IC die. The metallization structure has exposed substrate interconnects electrically connected to the respective die interconnects on an active sides of the IC dice to provide electrical connections to the IC dice.

The metallization structures of the IC package being split between the top and bottom metallization structures mounted on opposing sides of the IC die module may allow the combined thickness of the top and bottom metallization structures to be reduced without risking warpage or mechanical instability. The metallization structures of the IC package being split between the top and bottom metallization structures mounted on opposing sides of the IC die module also provides a symmetrical structure for the IC package and IC die module. Also, in exemplary aspects, the top metallization structure located adjacent to the top IC die can be configured to dominantly provide electrical traces involved in interconnections to the top IC die to minimize the complexity of electrical trace routing in the top metallization structure. The bottom metallization structure located adjacent to the bottom IC die can be configured to dominantly provide electrical traces involved in interconnections to the bottom IC die to also minimize the complexity of electrical trace routing in the bottom metallization structure. Minimizing the complexity of electrical trace routing in the metallization structures could be an important factor in reducing the height of the metallization structures and thus reducing the overall height of the IC package. Die-to-die interconnections can be provided by conductive structures (e.g., vias) that extend through available areas in the IC die module and electrically connect to the inside surfaces of the top and bottom metallization structures. Thus, as an example, through-silica-vias (TSVs) may not be required to provide die-to-die interconnections.

To further to facilitate shrinking the overall height of the IC package to conserve area, the bond between the IC dice stacked in a back-to-back configuration can be a compression bond (e.g., an oxide-to-oxide bond). For example, the compression bond can be a thermocompression bond. A thermocompression bond is a wafer bond that is also referred to as diffusion bond, pressure joint, thermocompression weld or solid-state weld. Thus, as an example, no adhesive need be used for IC die bonding. A compression bond may consume less or no additional area in the height direction of the IC package than an adhesive for example. Also, to further to facilitate shrinking the overall height of the IC package to conserve area, the bond between the active sides of the IC dice and their respective top and bottom metallization structures may also be a compression bond, and a thermocompression bond as an example.

In this regard, in one exemplary aspect, an IC package is provided. The IC package includes a first metallization structure including at least on first interconnect layer. The IC package also includes a second metallization structure including at least one second interconnect layer. The IC package also includes an IC die module disposed between the first metallization structure and the second metallization structure. The IC die module includes a first IC die including a first active surface first non-active surface. The IC die module also includes a second IC die including a second active surface and a second non-active surface, and a compression bond between the first non-active surface of the first IC die and to the second active surface of the second IC die coupling the first non-active surface of the first IC die to the second non-active surface of the second IC die. The first non-active surface of the first IC die is electrically coupled to the at least one first interconnect layer of the first metallization structure. The second non-active surface of the second IC die is electrically coupled to the at least one second interconnect layer of the second metallization structure.

In another exemplary aspect, a method of fabricating an IC package is provided. The method includes fabricating a first metallization structure including at least one first interconnect layer. The method also includes fabricating a second metallization structure including at least one second interconnect layer. The method also includes fabricating an IC die module disposed between the first metallization structure and the second metallization structure. Fabricating the IC die module includes providing a first IC die including a first active surface and a first non-active surface. The IC die module also includes providing a second IC die including a second active surface and a second non-active surface. Fabricating the IC die module also includes compression bonding the first non-active surface of the first IC die to the second non-active surface of the second IC die to couple the first IC die to the second IC die. The method also includes electrically coupling the first active surface of the first IC die to the at least one first interconnect layer of the first metallization structure, and electrically coupling the second active surface of the second IC die to the at least one second interconnect layer of the second metallization structure

BRIEF DESCRIPTION OF THE FIGURES

FIGS. 3A and 3B are right and left side views of the IC package in FIGS. 2A-2B to illustrate additional exemplary detail of the IC package;

FIGS. 4A and 4B are a flowchart illustrating an exemplary process of fabricating the IC package in FIGS. 2A-3B;

FIGS. 5A-5E are a flowchart illustrating another exemplary process of fabricating the IC package in FIGS. 2A-3B that includes bonding the IC dice in a back-to-back configuration and mounting the IC dice to their respective top and bottom metallization structures using thermocompression bonding;

FIGS. 6A-6J illustrate exemplary fabrication stages during fabrication of the IC package in FIGS. 2A-3B according to the exemplary process in FIGS. 5A-5E;

DETAILED DESCRIPTION

Figure 1:
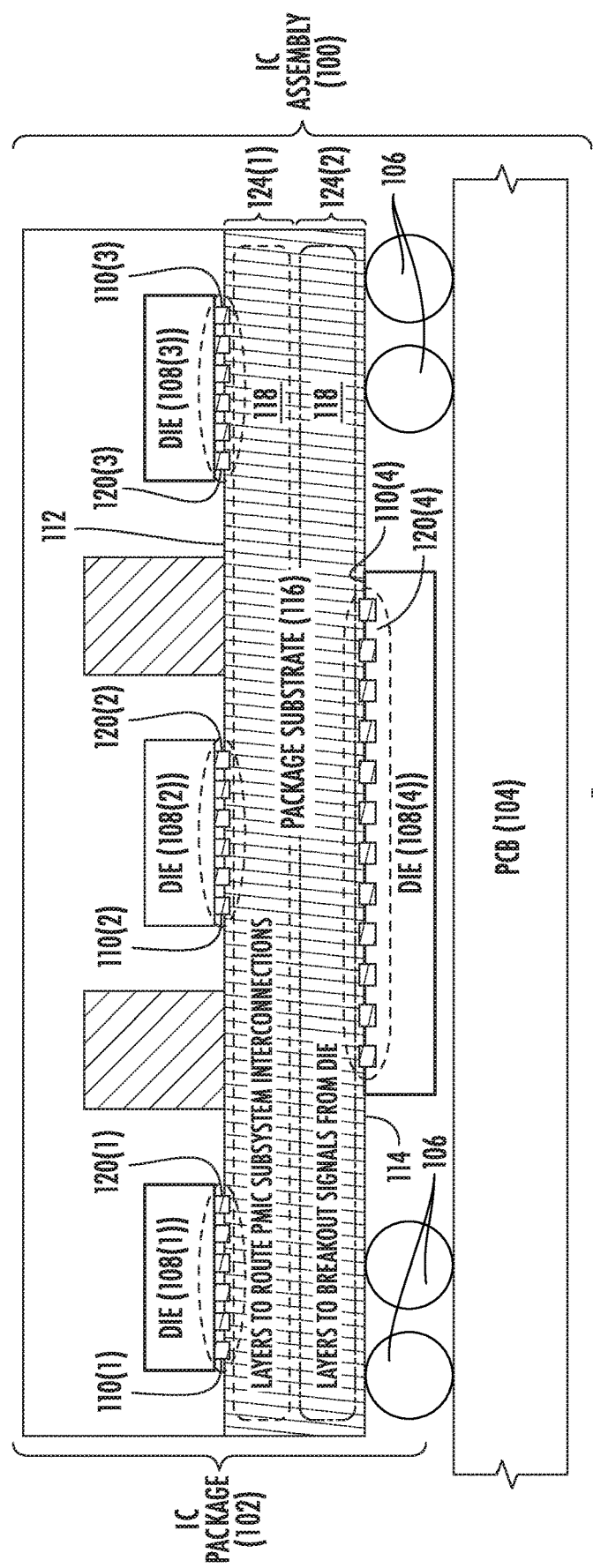
FIG. 1 is a side view of an exemplary flip-chip integrated circuit (IC) package that includes multiple semiconductor dice, each surface mounted on a package substrate and electrically connected to a metallization structure in the package substrate to make die connections.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Before discussing examples of integrated circuit (IC) packages employing split, double-sided metallization structures to facilitate an IC die module employing stacked dice starting at FIG. 2A, a flip-chip IC package that employs a common package substrate oriented between opposing IC dice mounted on opposing sides of the package substrate and electrically connected to the common package substrate to make die connections is first described in FIG. 1 below.

In this regard, FIG. 1 illustrates a schematic view of a cross-section of an IC assembly 100 that includes a flip-chip IC package 102 ("IC package 102") that is mounted to a printed circuit board (PCB) 104 using solder balls 106. The IC package 102 includes multiple semiconductor dice ("IC dice") 108(1)-108(4) that have respective front surfaces 110(1)-110(4) (i.e., active surfaces) that are mounted to respective front and bottom surfaces 112, 114 of a package substrate 116 via a die-to-die bonding and/or underfill adhesive. For example, the IC dice 108(1)-108(3) could be power management ICs (PMICs) that provide power management related functions. The IC die 108(4) could be an application IC die, such as a processor, as an example. The solder balls 106 are formed on the bottom surface 114 of the package substrate 116 to provide an electrical interface to the IC dice 108(1)-108(4) when the IC package 102 is mounted to the PCB 104. The package substrate 116 can be an embedded trace substrate (ETS) that includes one or more dielectric layers that include embedded electrical traces 118 (e.g., copper metal traces) coupled to the solder balls 106 to provide electrical signal routing between the solder balls 106 and the IC dice 108(1)-108(4). The electrical traces 118 in the package substrate 116 are coupled to solder balls 120(1)-120(4) exposed from the front and bottom surfaces 112, 114 of the package substrate 116 to provide electrical connections to the IC dice 108(1)-108(4). The IC dice 108(1)-108(4) include metal interconnects (e.g., pads) that are coupled to the respective solder balls 120(1)-120(4) when mounted to the package substrate 116 to provide an electrical connect to electrical traces 118 in the package substrate 116 that are routed to the solder balls 106 connected to the PCB 104. Die-to-die electrical connections between the IC dice 108(1)-108(4) can also be made through the coupling of the solder balls 120(1)-120(4) and the electrical traces 118 in the package substrate 116.

With continuing reference to FIG. 1, the package substrate 116 is comprised of a plurality of dielectric layers that may, for example, be laminated together to form the package substrate 116. Electrical traces 118 in different dielectric layers are coupled together through vias (not shown). To reduce routing complexity in the package substrate 116, the package substrate 116 can be designed so that its dielectric layers more involved with providing electrical connections to the IC dice 108(1)-108(4) can be located proximate to the respective IC dice 108(1)-108(4). In this regard, a dielectric layer region 124(1) of the package substrate 116 located closer to its front surface 112 and IC dice 108(1)-108(3) can include the electrical traces 118 involved with electrical interconnects to the solder balls 120(1)-120(3) coupled to the IC dice 108(1)-108(3). A dielectric layer region 124(2) of the package substrate 116 located closer to its bottom surface 114 and IC die 108(4) can include the electrical traces 118 more involved in providing electrical interconnects to the solder ball 120(4) coupled to the IC die 108(4). Providing a common package substrate 116 that includes electrical routing for electrical connections for all the IC dice 108(1)-108(4) can allow the package substrate 116 to be fabricated separately from the IC dice 108(1)-108(4) in a separate fabrication process for modularity and manufacturing flexibility. However, this may cause a larger number of dielectric layers to be required in the package substrate 116. For example, the package substrate 116 in FIG. 1 may have ten (10) dielectric layers. This can increase the complexity of the fabrication process to fabricate the package substrate 116 and lead to increased fabrication time and associated costs and lower yield. Through-silica vias (TSVs) could be employed to provide die-to-die interconnections, but TSVs are expensive in terms of fabrication processes.

Figure 2A:
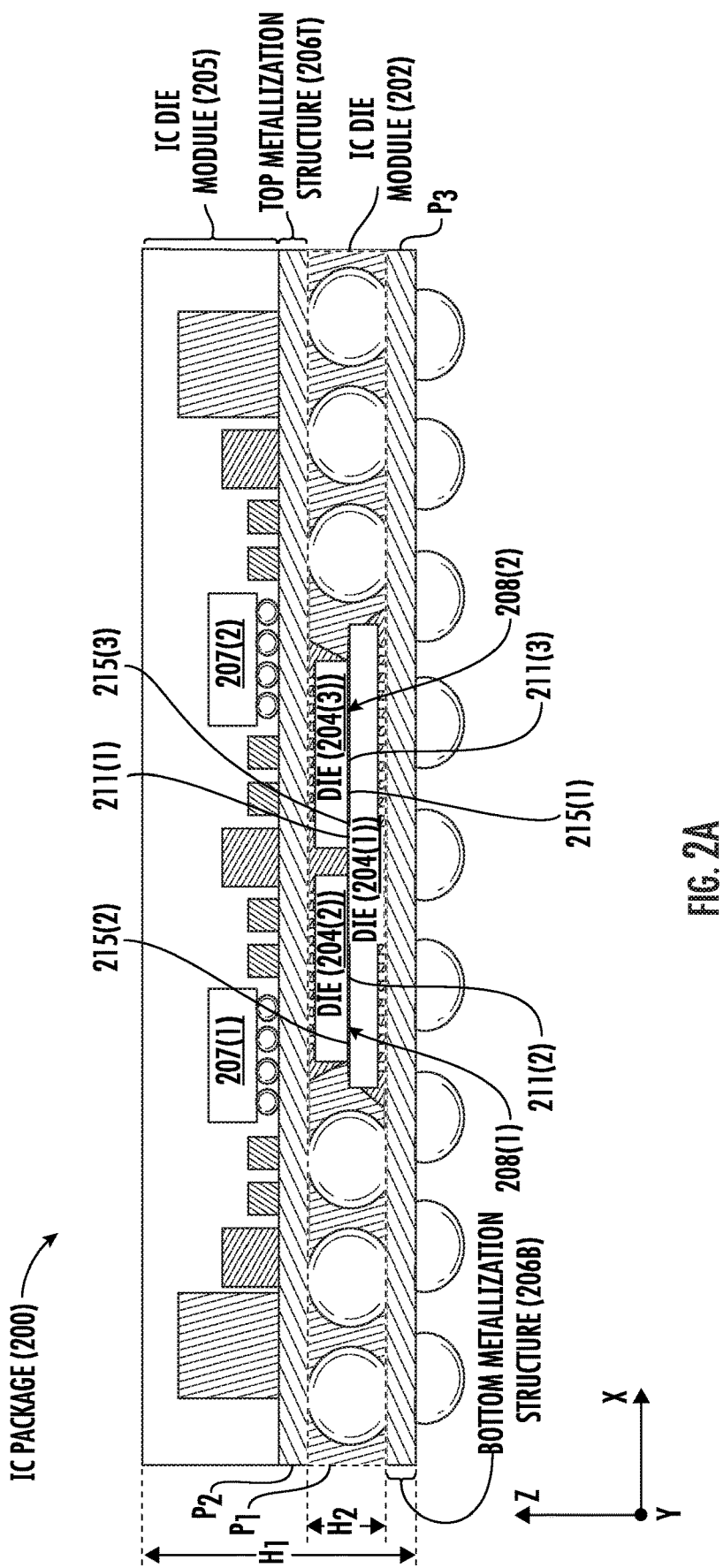
FIGS. 2A and 2B are side views of an exemplary IC package employing a semiconductor die ("IC die") module employing stacked IC dice formed between split, double-sided top and bottom metallization structures to provide die-to-die and external interconnections to the IC dice.
Figure 2B:
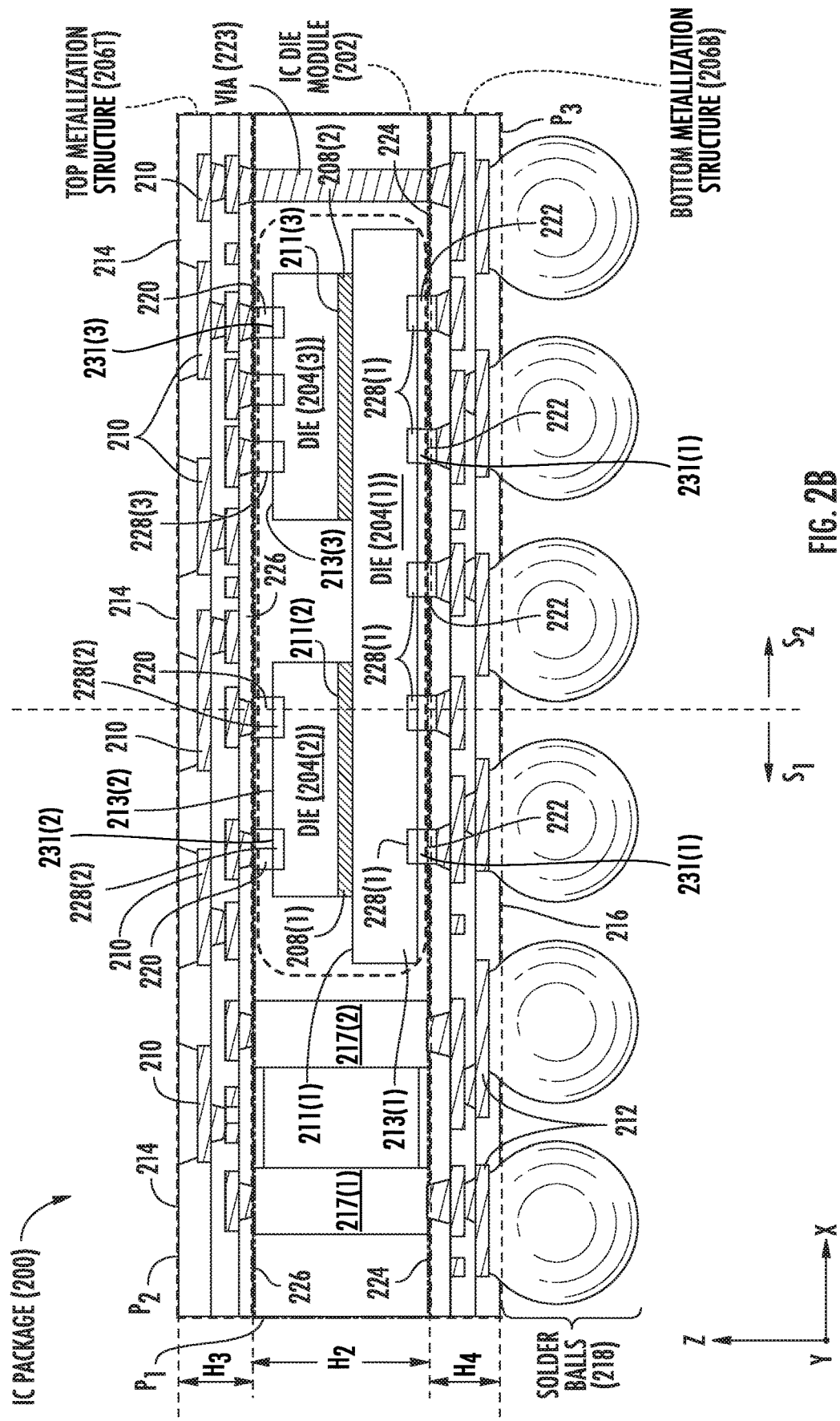

In this regard, FIGS. 2A and 2B are side view of an exemplary IC package 200 employing a semiconductor die ("IC die") module 202 employing stacked IC dice 204(1)-204(3). FIG. 2B is a side view that illustrates additional exemplary detail of the IC package 200 illustrated in FIG. 2A. As shown in FIG. 2A, the IC die module 202 is disposed in a horizontal plane $P_1$ in the X-axis and Y-axis directions and is formed between split, double-sided top and bottom metallization structures 206T, 206B to provide die-to-die and external interconnections to the IC dice 204(1)-204(3). The metallization structures 206T, 206B include one or more metal or interconnect layers of electrical traces for signal routing and vertical interconnect accesses (vias) to couple electrical traces together between different layers. The metallization structures 206T, 206B also serve as a support structure in which the IC die module 202 can be disposed on and supported. The metallization structures 206T, 206B may be a package substrate or redistributed layers (RDLs) as non-limiting examples. As discussed in more detail below, the metallization structures 206T, 206B can include interconnect layers that provide external and die-to-die electrical signal routing for the IC dice 204(1)-204(3) in the IC package 200. The top and bottom metallization structures 206T, 206B are disposed in horizontal planes $P_2$ and $P_3$ in the X-axis and Y-axis directions and parallel to the horizontal plane $P_1$ of the IC die module 202. As an example, IC die 204(1) could be an application specific die, such as a general processor as an example. One of IC dice 204(2), 204(3) could be a power management IC (PMIC) that controls power management functions for managing power to the IC die 204(1), as another example. Another of the IC dice 204(2), 204(3) could be a specific processor, such as a modem or baseband processor, as another example. A second IC die module 205 is also mounted on top of the top metallization structure 206T and includes other components including IC dice 207(1), 207(2) electrically connected to the top metallization structure 206T.

As discussed in more detail below, to minimize the overall height $H_1$ of the IC package 200 in FIG. 2A, as shown in the Z-axis direction, the IC dice 204(1) and 204(2), 204(3) are bonded (i.e., physically attached directly or indirectly) together in a back-to-back configuration in the IC die module 202. Minimizing the overall height $H_1$ of the IC package 200 may be important to maximize use of applications of the IC package 200. As discussed in more detail below, the IC dice 204(2), 204(3) are bonded to the IC die 204(1) with compression bonds 208(1), 208(2). For example, the compression bond may be a thermocompression bond that is an oxide-to-oxide thermocompression bond. Providing the compression bonds 208(1), 208(2) to secure IC dice 204(2), 204(3) to IC die 204(1) can minimize a height $H_2$ of the IC die module 202 and thus the overall height the $H_1$ of the IC package 200, because as an example the use of an additional binding material, such as adhesive may be avoided. A thermocompression bond is a wafer or bond that is also referred to as diffusion bond, pressure joint, and thermocompression weld. In this example, as shown in FIG. 2A, top, non-active surfaces 211(2), 211(3) of the respective IC dice 204(2), 204(3) are brought into atomic contact with a top, non-active surface 211(1) of the IC die 204(1) applying force and optionally heat simultaneously to form a compression bond. The IC dice 204(2), 204(3) are flipped upside down from IC die 204(1) in FIG. 2A.

For example, the top, non-active surfaces 211(1)-211(3) of the respective IC dice 204(1)-204(3) may be include a respective oxide layer 215(1)-215(3) so that the non-active surfaces 211(2), 211(3) of the respective IC dice 204(2), 204(3) are bonded in an oxide-to-oxide compression bonding with the top, non-active surface 211(1) of the IC die 204(1). For example, the top, non-active surfaces 211(1)-211(3) of the respective IC dice 204(1)-204(3) and their oxide layers 215(1)-215(3) are bonded together by compression bonding and thermocompression bonding for example. In thermocompression bonding, diffusion between the top, non-active surfaces 211(2), 211(3) and their oxide layers 215(2), 215(3) of the IC dice 204(2), 204(3) are brought into atomic contact with the top, non-active surface 211(1) and its oxide layer 215(1) of the IC die 204(1). The atoms from the oxide layers 215(2), 215(3) of the IC dice 204(2), 204(3) and the oxide layer 215(1) of top, non-active surface 211(1) of the IC die 204(1) migrate from one crystal lattice to the other based on crystal lattice vibration causing the top, non-active surfaces 211(2), 211(3) and top, non-active surface 211(1) to stick and bond together. As another example, the oxide layers 215(1)-215(3) be a chemical mechanical polish (CMP)-treated oxide layers 215(1)-215(3) formed by plasma-enhanced chemical vapor deposition (PE-CVD). After plasma activation, the IC dice 204(1)-204(3) with the PE-CVD oxide layers 215(1)-25(3) can be driven by liquid surface tension and precisely aligned, and subsequently tightly bonded to the wafers through the oxide-oxide direct bonding. After the top, non-active surfaces 211(1)-211(3) of the IC dice 204(1)-204(3) are mounted back-to-back, and then baked at a specific temperature, such as 150 to 180 degrees Celsius, the oxide layers 215(1)-215(3) of each IC die 204(1)-204(3) start diffusion to then bond without the need to use any adhesive.

With continuing reference to FIG. 2A, because the IC dice 204(1) and 204(2), 204(3) are bonded together, the split top and bottom metallization structures 206T, 206B are provided above and below the respective IC dice 204(2), 204(3) and 204(1) to facilitate external electrical signal access to the IC dice 204(1)-204(3) in the IC package 200 and to provide die-to-die interconnections. In this regard, the top and bottom metallization structures 206T, 206B can be embedded trace substrates (ETSs) that include electrical traces in one or more dielectric material layers to provide electrical signal routing. As shown in a more detailed illustration of the IC package 200 in FIG. 2B, the top and bottom metallization structures 206T, 206B provide external substrate interconnects 210, 212 exposed through respective top and bottom outer surfaces 214, 216 of the respective top and bottom metallization structures 206T, 206B, to provide electrical signal access to the IC dice 204(1)-204(3) in the IC package 200. For example, solder balls 218 shown in FIG. 2B are electrically connected to the external substrate interconnects 212 in the bottom metallization structure 206B to provide an external interface through the bottom metallization structure 206B to the IC die 204(1). Solder balls could also be provided that are electrically connected to the external substrate interconnects 210 in the top metallization structure 206T to provide an external interface through the top metallization structure 206T to the IC dice 204(2), 204(3).

Note that terms "top" and "bottom" are relative terms and the metallization structure 206T in FIGS. 2A and 2B are labeled "top" as being oriented above the bottom metallization structure 206B in this example. But also note that the IC package 200 could also be oriented where it is rotated 180 degrees from as shown in FIG. 2 where the bottom metallization structure 206B would be above the top metallization structure 206T. Thus, the terms "top" and "bottom" are relative terms and not meant to imply a limitation about the orientation of one metallization structure 206T to the other metallization structure 206B.

With continuing reference to FIG. 2B, the top and bottom metallization structures 206T, 206B also provide die interconnections to the respective IC dice 204(2), 204(3) and 204(1) through internal bottom and top substrate interconnects 220, 222 exposed through respective bottom and top inside surfaces 226, 224 of the respective top and bottom metallization structures 206T, 206B. Die interconnects 228(1)-228(3) (e.g., metal pads) of the respective IC dice 204(1)-204(3) are electrically connected to the internal substrate interconnects 220, 222. The die interconnects 228(1) of the first IC die 204(1) are exposed through a bottom, active surface 213(1) of the first IC die 204(1). The die interconnects 228(2) of the second IC die 204(2) are exposed through a bottom, active surface 213(2) of the second IC die 204(2). The die interconnects 228(3) of the third IC die 204(3) are exposed through a bottom, active surface 213(3) of the third IC die 204(3). The die interconnects 228(1)-228(3) couple the respective IC dice 204(1)-204(3) through the internal substrate interconnects 220, 222 and through the bottom and top metallization structures 206B, 206T to their respective external substrate interconnects 210, 212 to provide external electrical signal access to the IC dice 204(1)-204(3) in the IC package 200. Thus, by the top and bottom metallization structures 206T, 206B both having respective internal bottom and top substrate interconnects 220, 222, and external top and bottom substrate interconnects 210, 212, the top and bottom metallization structures 206T, 206B are "double-sided."

In this example, the die interconnects 228(1)-228(3) of the respective IC dice 204(1)-204(3) can be bonded to the internal substrate interconnects 220, 222 and through the bottom and top metallization structures 206B, 206T through respective compression bonds 231(1)-231(3) to their respective external substrate interconnects 210, 212 to provide external electrical signal access to the IC dice 204(1)-204(3) in the IC package 200. In this regard, the die interconnects 228(1)-228(3) of the respective IC dice 204(1)-204(3) are brought into atomic contact with the internal substrate interconnects 220, 222 and through the bottom and top metallization structures 206B, 206T by applying force and optionally heat simultaneously. The diffusion between the die interconnects 228(1)-228(3) of the IC dice 204(2), 204(3) are brought into atomic contact with the internal substrate interconnects 220, 222. The atoms from the bottom active surfaces 213(2), 213(3) of the IC dice 204(1)-204(3) and the internal substrate interconnects 220, 222 of the bottom and top metallization structures 206B, 206T migrate from one crystal lattice to the other based on crystal lattice vibration causing the die interconnects 228(1)-228(3) and internal substrate interconnects 220, 222 to stick and interface together.

The splitting of the metallization structure of the IC package 200 as shown in FIGS. 2A and 2B between the top and bottom metallization structures 206T, 206B can also facilitate more efficient, less complex routing of the electrical traces in the top and bottom metallization structures 206T, 206B for providing electrical signal access to the respective IC dice 204(2), 204(3) and 204(1). For example, the top metallization structure 206T located above and most closely adjacent to the top IC dice 204(2), 204(3) can be designed to include electrical traces that are dominantly involved in interconnections to, and thus electrical signal routing with, the top IC dice 204(2), 204(3). Note that "top" and "bottom" for the IC dice 204(1)-204(3) are relative terms, meaning that top IC dice 204(2), 204(3) are positioned adjacent to the top metallization structure 206T, and the bottom IC die 204(1) is positioned adjacent to the bottom metallization structure 206T.

Similarly, the bottom metallization structure 206B located below and most closely adjacent to the bottom IC die 204(1) can be designed to include electrical traces that are dominantly involved in interconnections to, and thus electrical signal routing with, the bottom IC die 204(1). This allows the electrical traces involved for interconnections and signal routing with the bottom IC die 204(1) to have to be included in the same metallization structure as the electrical traces involved for interconnections and signal routing with the top IC dice 204(2), 204(3). If electrical traces involved for interconnections and signal routing for all the IC dice 204(1)-204(3) were provided in a single metallization structure, additional routing layers may have to be provided in the metallization structure to provide sufficient "white space" to avoid interference between electrical traces. These additional routing layers could add additional thickness to the metallization structure thereby increasing the overall height of an IC substrate in an undesired manner.

Also, by providing the split, top and bottom metallization structures 206T, 206E in the IC package 200 in FIG. 2, additional mechanical stability may be realized that can result in reduced warpage while minimizing the routing layers in the top and bottom metallization structures 206T, 206B. This is because the top and bottom metallization structures 206T, 206B are fully bonded to the IC die module 202, meaning that the bottom and top inside surfaces 226, 224 of the respective top and bottom metallization structures 206T, 206B are bonded to the IC die module 202. This is in contrast, for example, to an IC package that includes a single metallization structure between IC dice mounted to the opposite top and bottom outer surfaces of the single metallization structure to form an IC package. There would be no intermediate IC die module 202 fully bonded to the single metallization structure in this alternative example. Thus, such an IC package that includes such a single metallization structure may be more susceptible to warpage and/or mechanical instability. Thus, such a single metallization structure may have to include additional dielectric layers to add more mechanical stability and/or avoid or reduce warpage, which then would increase the overall height of such an IC package.

With reference to FIG. 2B, the top and bottom metallization structures 206T, 206B of the package 200 also facilitate die-to-die interconnections between IC die 204(1) and IC dice 204(2), 204(3) through the internal substrate interconnects 220, 222. A vertical interconnect access (via) 223 can be formed in the IC die module 202 that is electrically coupled to and between internal substrate interconnects 220, 222 of the top and bottom metallization structures 206T, 206B, respectively, to provide electrical signal routing between the top and bottom metallization structures 206T, 206B and to the IC dice 204(1)-204(3) through the respective die interconnects 228(1)-228(3). Optional passive electrical components 217(1), 217(2), such as inductors or capacitors, can also be formed in the IC die module 202 adjacent to the IC dice 204(1)-204(3) and interconnected to/between substrate interconnects in the top and bottom metallization structures 206T, 206B. Also, for example, other IC packages may provide a single metallization structure between IC dice mounted to the opposite top and bottom outer surfaces of the single metallization structure to form an IC package. However, the thickness of a single metallization structure such an IC package may have to include additional dielectric layers to avoid warpage or mechanical instability, thus leading to an overall taller IC package than the IC package 200 in FIGS. 2A and 2B as an example.

Figure 3A:
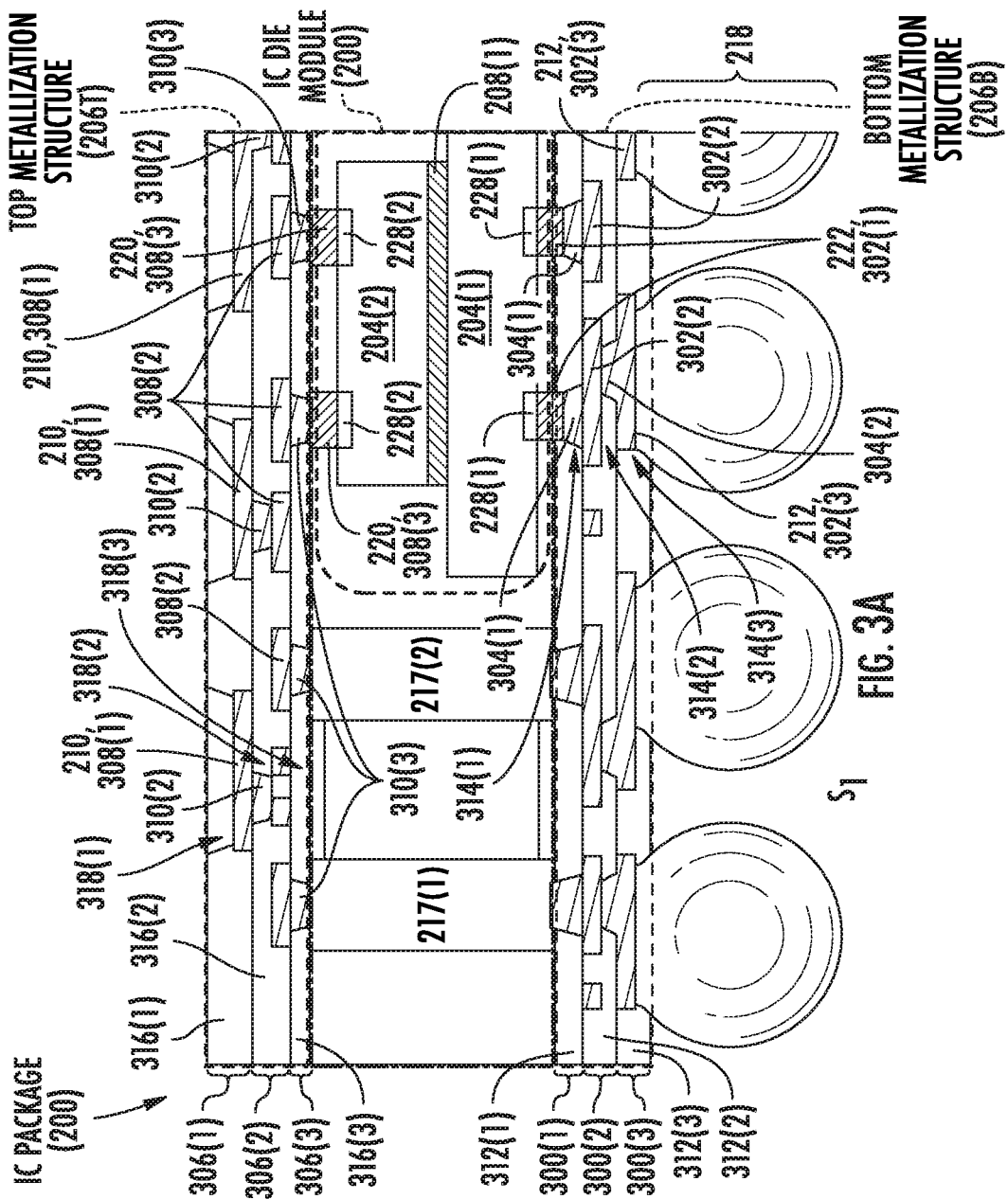

To provide additional exemplary detail regarding the IC package 200 in FIGS. 2A and 2B, FIGS. 3A and 3B are provided. FIG. 3A is a left side view of the IC, package 200 in FIGS. 2A and 2B in section S1. FIG. 3B is a right side view of the IC package 200 in FIGS. 2A and 2B in section S2. As show in FIGS. 3A and 3B, the IC package 200 includes the bottom metallization structure 206B and top metallization structure 206T. The bottom metallization structure 206B includes multiple interconnect layers 300(1)-300(3) as shown in FIGS. 3A and 3B that are dielectric layers that may be fabricated from a ceramic material in the laminated dielectric layers as a substrate or fabricated as redistribution layers (RDLs), as non-limiting examples. The top interconnect layer 300(1) includes the top internal substrate interconnects 222 that are metal contacts 302(1) in this example in contact with vias 304(1). The vias 304(1) are also in contact with metal contacts 302(2) in an intermediate interconnect layer 300(2) between the top and bottom interconnect layers 300(1), 300(3). The metal contacts 302(2) in the interconnect layer 300(2) are also in contact with vias 304(2) in the interconnect layer 300(2). The vias 304(2) are in contact with bottom external substrate interconnects 212 that are metal contacts 302(3) in this example in a bottom interconnect layer 300(3). The metal contacts 302(3) are in electrical contact with the solder balls 218 to provide an external electrical signal interface through the bottom metallization structure 206B to the IC die 204(1). At least one of the metal contacts 302(3) in the interconnect layer 300(3) is electrically coupled to at least one metal contact 302(1) in the interconnect layer 300(1) to provide an external electrical interface between the solder balls 218 and the IC die 204(1). The metal contacts 302(1)-302(3) may be fabricated from copper that has a high conductivity for lower signal routing resistance and higher electrical performance.

With continuing reference to FIGS. 3A and 3B, the IC package 200 also includes the top metallization structure 206T that includes multiple interconnect layers 306(1)-306(3) as shown in FIGS. 3A and 3B that are dielectric layers and may be fabricated from a ceramic material in the laminated dielectric layers or fabricated as RDLs as examples. The top interconnect layer 306(1) includes the top external substrate interconnects 210 that are metal contacts 308(1) in this example in contact with vias 310(2) in an intermediate interconnect layer 306(2) between the top and bottom interconnect layers 306(1), 306(3). The vias 310(2) are also in contact with metal contacts 308(2) in the interconnect layer 306(2). The metal contacts 308(2) in the interconnect layer 306(2) are also in contact with vias 310(3) in the interconnect layer 300(3). The vias 310(3) are in contact with the bottom internal substrate interconnects 220 that are metal contacts 308(3) in this example in interconnect layer 300(3). The metal contacts 308(3) are in electrical contact with the solder balls 218 to provide an external electrical signal interface through the bottom metallization structure 206B to the IC die 204(1). At least one of the metal contacts 308(3) in the bottom interconnect layer 306(3) is electrically coupled to at least one metal contact 308(1) in interconnect layer 300(1) to provide an external electrical interface to the IC dice 204(2), 204(3). The metal contacts 308(1)-308(3) may be fabricated from copper that has a high conductivity for lower signal routing resistance and higher electrical performance.

With reference to FIG. 3B, the via 223 formed in the IC die module 202 is electrically coupled to and between a metal contact 308(2) of the top metallization structure 206T and a metal contact 302(2) of the bottom metallization structure 206T. The via 223 provides electrical signal routing between the top and bottom metallization structures 206T, 206B and to the IC dice 204(1)-204(3) through the respective die interconnects 228(1)-228(3).

With continuing reference to FIGS. 3A and 3B, the interconnect layers 300(1)-300(3) and 306(1)-306(3) of the bottom and top metallization structures 206B, 206T, respectively, may be RDLs. In this regard, with reference to the interconnect layers 300(1)-300(3) in the bottom metallization structure 206B in FIG. 3B, the bottom interconnect layer 300(3) may include a passivation layer 312(3), such as a dielectric material layer, that is disposed partially below the metal contacts 302(3). The metal contacts 302(3) are disposed in openings 314(3) in the passivation layer 312(3). The intermediate interconnect layer 300(2) may also include a passivation layer 312(2), such as a dielectric material layer, that is disposed partially above the metal contacts 302(2). The vias 304(2) and metal contacts 302(2) are disposed in openings 314(2) in the passivation layer 312(2). The top interconnect layer 300(1) may also include a passivation layer 312(1), such as a dielectric material layer, that is disposed partially above the vias 304(1) and metal contacts 302(1). The vias 304(1) and metal contacts 302(1) are disposed in openings 314(1) in the passivation layer 312(1).

With reference to the interconnect layers 306(1)-306(3) in the top metallization structure 206T in FIG. 3A, the top interconnect layer 306(1) may include a passivation layer 316(1), such as a dielectric material layer, that is disposed partially above the metal contacts 308(1). The metal contacts 308(1) are disposed in openings 318(1) in the passivation layer 316(1). The intermediate interconnect layer 306(2) may also include a passivation layer 316(2), such as a dielectric material layer, that is disposed partially above the metal contacts 308(2). The vias 310(2) and metal contacts 308(2) are disposed in openings 318(2) in the passivation layer 316(2). The bottom interconnect layer 306(3) may also include a passivation layer 316(3), such as a dielectric material layer, that is disposed partially below the vias 310(2) and metal contacts 308(2). The vias 310(3) and metal contacts 308(3) are disposed in openings 318(3) in the passivation layer 316(3).

With reference back to FIG. 2B, the respective heights $H_3$, $H_4$, and $H_2$ of the top metallization structure 206T, the bottom metallization structure 206B, and the IC die module 202 can be designed to achieve the overall height $H_1$ of the IC package 200, as shown in the Z-axis direction in FIG. 2A. The height $H_3$ of the top metallization structure 206T, as shown in the Z-axis direction, may be between fifteen (15) micrometers (μm) (1 L) and 150 μm (10 L) as non-limiting examples. The height $H_4$ of the bottom metallization structure 206B, as shown in the Z-axis direction, may be between fifteen (15) μm (1 L) and 150 μm (10 L) as non-limiting examples. The height $H_2$ of the IC die module 202, as shown in the Z-axis direction, may be between 100 μm and 600 μm as examples. The ratio of the height $H_2$ of the IC die module 202 to the combined heights $H_3+H_4$ of the top and bottom metallization structures 206T, 206B may be between 0.33 and twenty (20) as non-limiting examples.

Figure 4A:
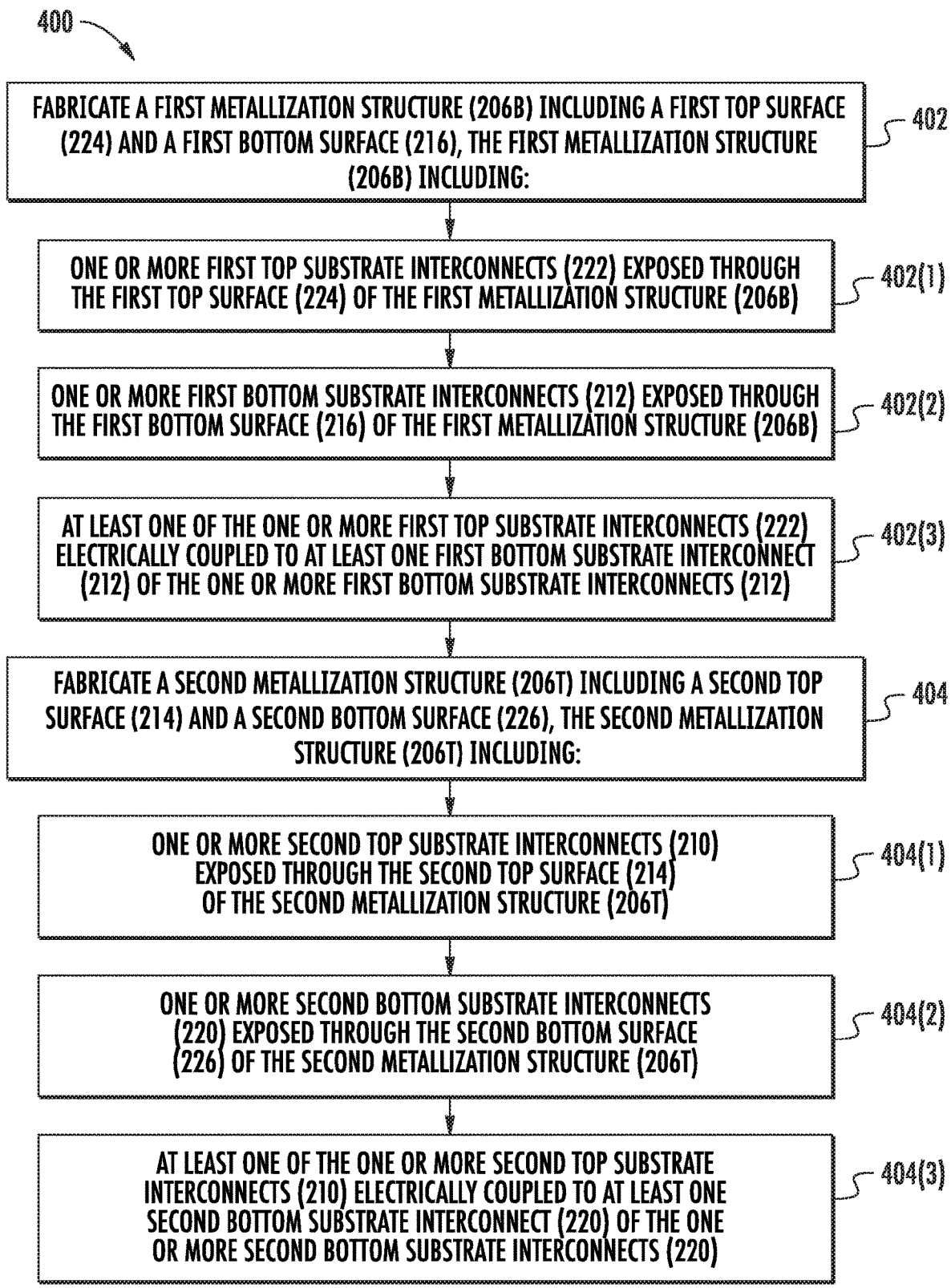

FIGS. 4A and 4B illustrate a flowchart illustrating an exemplary process 400 of fabricating the IC package 200 in FIGS. 2A-3B. In this regard, as shown in FIG. 4A, the process 400 includes fabricating a first metallization structure 206B that includes at least one first interconnect layer 300, such as interconnect layers 300(1)-300(3) described above and shown in FIGS. 3A and 3B (block 402 in FIG. 4A). The first metallization structure 206B includes a first top surface 224 and a first bottom surface 216. In the exemplary IC package 200, the first metallization structure 206B includes one or more first top substrate interconnects 222 exposed through the first top surface 224 of the first metallization structure 206B. The first metallization structure 206B also includes one or more first bottom substrate interconnects 212 exposed through the first bottom surface 216 of the first metallization structure 206B. The first metallization structure 206B also includes at least one of the one or more first top substrate interconnects 222 electrically coupled to at least one first bottom substrate interconnect 212 of the one or more first bottom substrate interconnects 212.

With continuing reference to FIG. 4A, the process 400 also includes fabricating a second metallization structure 206T that includes at least one second interconnect layer 306, such as interconnect layers 306(1)-306(3) described above and shown in FIGS. 3A and 3B (block 404 in FIG. 4A). In the exemplary IC package 200, the second metallization structure 206T includes a second top surface 214 and a second bottom surface 226. The second metallization structure 206T also includes one or more second top substrate interconnects 210 exposed through the second top surface 214 of the second metallization structure 206T. The second metallization structure 206T also includes one or more second bottom substrate interconnects 220 exposed through the second bottom surface 226 of the second metallization structure 206T. The second metallization structure 206T also includes at least one of the one or more second top substrate interconnects 210 electrically coupled to at least one second bottom substrate interconnect 220 of the one or more second bottom substrate interconnects 220.

With continuing reference to FIG. 4A, the process 400 also includes fabricating an IC die module 202 disposed between the first metallization structure 206B and the second metallization structure 206T (block 406 in FIG. 4A). Fabricating the IC die module 202 includes providing the first IC die 204(1) comprising a first active surface 213(1) and a first non-active surface 211(1) (block 406(1) in FIG. 4A). Fabricating the IC die module 202 also includes providing the second IC die 204(2) including a second active surface 213(2) and a second non-active surface 211(2) (block 406(2) in FIG. 4A). Fabricating the IC die module 202 also includes compression bonding the first non-active surface 211(1) of the first IC die 204(1) to the second non-active surface 211(2) of the second IC die 204(2) (block 406(3) in FIG. 4A). For example, the first non-active surface 211(1) of the first IC die 204(1) and the second non-active surface 211(2) of the second IC die 204(2) can be compression bonded together in a back-to-back configuration. The first non-active surface 211(1) of the first IC die 204(1) can be compression bonded to the second non-active surface 211(2) of the second IC die 204(2) to couple the first IC die 204(1) to the second IC die 204(2).

With reference to FIG. 4B, fabricating the IC package 200 also comprises electrically coupling the first active surface 213(1) of the first IC die 204(1) to at least one first interconnect layer 300 of the first metallization structure 206B (block 408) in FIG. 4B). For example, in the IC package 200, electrically coupling the first active surface 213(1) of the first IC die 204(1) to at least one first interconnect layer 300 of the first metallization structure 206B can include electrically coupling at least one of the one or more first die interconnects 228(1) of the first IC die 204(1) to at least one of the one or more first bottom substrate interconnects 222 of the first metallization structure 206B. Fabricating the IC die module 202 also comprises electrically coupling the second active surface 213(1) of the second IC die 204(2) to at least one second interconnect layer 306 of the second metallization structure 206T (block 410 in FIG. 4B). For example, in the IC package 200, electrically coupling the second active surface 213(2) of the second IC die 204(2) to at least one second interconnect layer 306 of the second metallization structure 206T can include electrically coupling at least one of the one or more second die interconnects 228(2) of the second IC die 204(2) to at least one of the one or more first bottom substrate interconnects 220 of the second metallization structure 206T.

As discussed above, the split, top and bottom metallization structures 206T, 206B of the IC package 200 in FIG. 2 may include RDLs that are fabricated according to an RDL fabrication process. An RDL, is a distribution of a metal (e.g., copper) pad layer on a dielectric material layer. A second dielectric material layer is formed over the metal layer and then patterned to open up access to the underlying metal layer. A second metal pad layer can be distributed across the second dielectric layer and down into the opening to form an interconnect between the second metal pad layer and the first metal pad layer. The substrate interconnects 210, 220 of the top metallization structure 206T and the substrate interconnects 212, 222 of the bottom metallization structure 206B can be formed by exposed metal layer/pads from respective inside surfaces RDL of the top and bottom metallization structures 206T, 206B. The top and bottom metallization structures 206T, 206B can be formed by RDLs can reduce the electrical resistance of the respective internal substrate interconnects 220, 222 to the die interconnects 228(1)-228(3) of the IC dice 204(1)-204(3), because the internal substrate interconnects 220, 222 are formed for a metal layer/pad in the RDL exposed on the inside surfaces 224, 226 of the top and bottom metallization structures 206T, 206B. The metal layer/pads formed in the RDLs of the top and bottom metallization structures 206T, 206B are more conductive and may have less resistance over other types of interconnects, such as solder balls.

In this regard, FIGS. 5A-5E illustrate a flowchart illustrating an exemplary process 500 of fabricating the IC package 200 in FIGS. 2A-3B that includes forming the top and bottom metallization structures 206T, 206B as substrates. FIGS. 6A-6J illustrate exemplary fabrication stages for each of the process steps in FIGS. 5A-5E of the IC package 200 in FIGS. 2A-3B as the fabrication process occurs. The process steps in FIGS. 5A-5E and the exemplary related fabrication stages in FIGS. 6A-6J will be described in conjunction below.

With reference to FIG. 5A, the process of fabricating the IC package 200 in FIGS. 2A-3B includes providing and preparing the IC dice 204(1)-204(3) for their back-to-back bonding as part of the IC package 200. In this regard, FIG. 6A illustrates an IC die 204 in a fabrication stage 600A, wherein the IC die 204 can be any of the IC dice 204(1)-204(3). Only one IC die 204 is shown in FIG. 6A, but note that the IC die 204 in FIG. 6A can be any of the IC dice 204(1)-204(3). The IC die 204 is prepared by thinning the top, non-active surface 211 of the IC die 204 shown in the fabrication stage 600B in FIG. 613 (block 502 in FIG. 5A). An oxide layer 602 is then added to the top, non-active surface 211 of the IC die 204 to prepare the top, non-active surface 211 of the IC die 204 for an oxide-to-oxide compression bonding to another bottom, non-active surface of another IC die 204 (block 504 in FIG. 5A).

A next process step in the fabrication process 500 involves preparing the IC dice 204(1)-204(3) of the IC package 200 to be compression bonded together in a back-to-back configuration. This is shown in the exemplary fabrication stages 600C and 600D in FIGS. 6C and 6D. As shown in the fabrication stage 600C in FIG. 6C, a temporary bonding film 604(1) is formed on the active, bottom surface 213(1) of the IC die 204(1) and mounted to a carrier 606(1) to be able to handle the IC die 204(1) during the bonding process (block 506 in FIG. 5B). Also as shown in the fabrication stage 600C in FIG. 6C, a temporary bonding film 604(2) is formed on the active, bottom surfaces 213(2), 213(3) of the IC dice 204(2), 204(3) and mounted to a carrier 606(2) to be able to handle the IC dice 204(2), 204(3) during the bonding process (block 506 in FIG. 5B). For example, the carriers 606(1), 606(2) allow the IC dice 204(1)-204(3) to be manipulated and aligned for the bonding of the oxide layers 602(1)-602(3) on the respective top, non-active surfaces 211(1)-211(3) of the IC dice 204(1)-204(3) together to bond the IC dice 204(1)-204(3) together as part of forming the IC die module 202 of the IC package 200 in FIGS. 2A-3B, as shown in the fabrication stage 600D in FIG. 6D (block 508 in FIG. 5B).

For example, the top, non-active surfaces 211(1)-211(3) of the respective IC dice 204(1)-204(3) and their oxide layers 215(1)-215(3) are bonded together by compression bonding and thermocompression bonding. In thermocompression bonding, diffusion between the top, non-active surfaces 211(2), 211(3) and their oxide layers 215(2), 215(3) of the IC dice 204(2), 204(3) are brought into atomic contact with the top, non-active surface 211(1) and its oxide layer 215(1) of the IC die 204(1). The atoms from the oxide layers 215(2), 215(3) of the IC dice 204(2), 204(3) and the oxide layer 215(1) of the top, non-active surface 211(1) of the IC die 204(1) migrate from one crystal lattice to the other based on crystal lattice vibration causing the top, non-active surfaces 211(2), 211(3) and the top, non-active surface 211(1) to stick and bond together. As another example, the oxide layers 215(1)-215(3) can be chemical mechanical polish (CMP)-treated oxide layers 215(1)-215(3) formed by plasma-enhanced chemical vapor deposition (PE-CVD).

After plasma activation, the IC dice 204(1)-204(3) with the PE-CVD oxide layers 215(1)-215(3) can be driven by liquid surface tension and precisely aligned, and subsequently tightly bonded to the wafers through the oxide-oxide direct bonding. After the top, non-active surfaces 211(1)-211(3) of the IC dice 204(1)-204(3) are mounted back-to-back, and then baked at a specific temperature, such as 150 to 180 degrees Celsius, the oxide layers 215(1)-215(3) of each IC die 204(1)-204(3) start diffusion to then bond without the need to use any adhesive.

A next process step in the fabrication process 500 involves preparing the bottom and top metallization structures 206B, 206T that the IC, dice 204(1)-204(3) are mounted as part of the IC package 200, which is shown in fabrication stages 600E and 600F in FIGS. 6E and 6F-1-6F-2. The mounting of the IC dice 204(1)-204(3) to the bottom and top metallization structures 206B, 206T is aligned so that the die interconnects 228(1)-228(3) of the IC dice 204(1)-204(3) are electrically connected to respective bottom and top substrate interconnects 220, 222 of the bottom and top metallization structures 206B, 206T to provide electrical connections to the IC dice 204(1)-204(3). In this regard, as shown in the fabrication stage 600E in FIG. 6E, the bottom metallization structure 206B is provided. Vias 223, which may be solder balls for example, are formed on the bottom metallization structure 206B to provide interconnections from the bottom metallization structure 206B to the top metallization structure 206T (block 510 in FIG. 5C). The bottom metallization structure 206B is fabricated and/or processed so that bottom substrate interconnects 222 are exposed through the inside surface 226 of the bottom metallization structure 206B (block 510 in FIG. 5C). As shown in the fabrication stage 600F in FIG. 6F-1, the top metallization structure 206T is provided. The top metallization structure 206T is fabricated and/or processed so that bottom substrate interconnects 220 are exposed through the inside surface 224 of the top metallization structure 206T (block 512 in FIG. 5C). The top and bottom substrate interconnects 222, 220 of the bottom and top metallization structures 206B, 206T are then compression bonded 608 (e.g., thermocompression bonded) to the die interconnects 228(1)-228(3) of the IC dice 204(1)-204(3) (block 512 in FIG. 5C). This is also shown in a more detailed illustration of fabrication stage 600F in FIG. 6F-2 for compression bonding of the IC die 204(2) in the top metallization structure 206T, but is also applicable for the compression bonding of the IC dice 204(1), 204(3) to the respective bottom and top metallization structures 206B, 206T. As shown in FIG. 6F-2, bottom substrate interconnects 220 of the top metallization structure 206T are compression bonded e.g., thermocompression bonded) to the die interconnects 228(2) of the IC die 204(2) to form compression bonds 610(2). Then, as shown in fabrication stage 600G in FIG. 6G, a dielectric material 613 is disposed between the top and bottom metallization structures 206T, 206B to add structure to protect the IC dice 204(1)-204(3) and vias 223 and to prevent electrical shorting (block 514 in FIG. 5D).

For example, a compression joint 608 forms a bond between the top and bottom substrate interconnects 222, 220 of the bottom and top metallization structures 206B, 206T to the die interconnects 228(1)-228(3) of the IC dice 204(1)-204(3) through compression bonding and thermocompression bonding, in compression bonding, diffusion between the top and bottom substrate interconnects 222, 220 of the bottom and top metallization structures 206B, 206T and the die interconnects 228(1)-228(3) of the IC dice 204(1)-204(3) are brought into atomic contact. The atoms from the top and bottom substrate interconnects 222, 220 of the bottom and top metallization structures 206B, 206T of the die interconnects 228(1)-228(3) of the IC dice 204(1)-204(3) migrate from one crystal lattice to the other based on crystal lattice vibration causing the bottom substrate interconnects 222, 220 of the bottom and top metallization structures 206B, 206T to stick and bond together. Thermal pressure can also be applied by baking during the compression bonding to enhance the diffusion, such as at temperatures between 230-280 degrees Celsius.

Figure 6J:
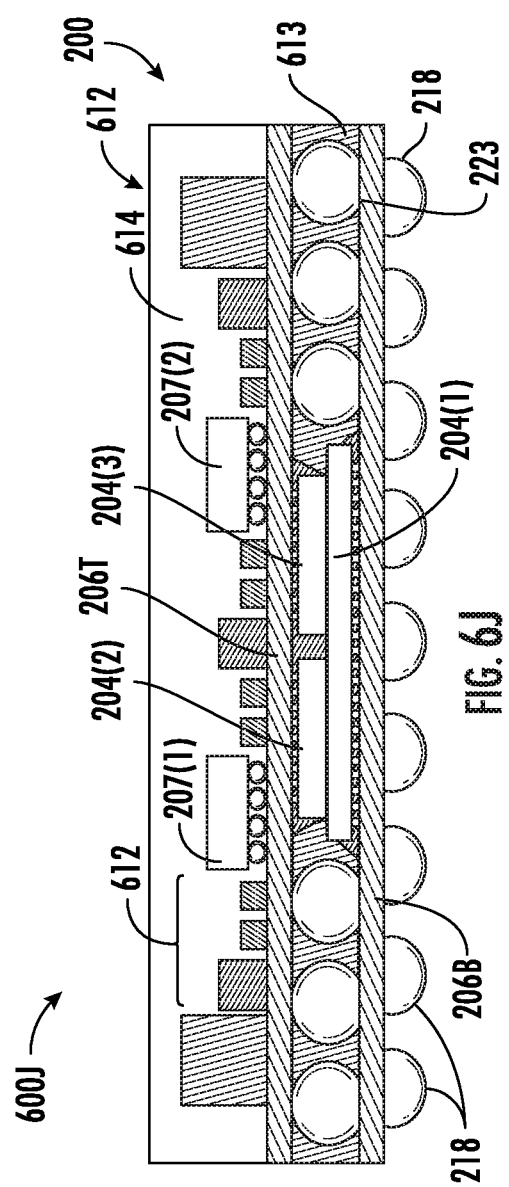

Then, in a next fabrication stage 600H as shown in FIG. 6H, additional electrical components, such as the IC dice 207(1), 207(2) and other electrical components 612 can be mounted to the top metallization structure 206T as part of the IC package 200 (block 516 in FIG. 5E). Then, in a next fabrication stage 600I as shown in FIG. 6I, a dielectric material 614 or molding compound can be disposed over the IC dice 207(1), 207(2) and other electrical components 612 for protection as part of the IC package 200 (block 518 in FIG. 5E). Then, in a next fabrication stage 600J as shown in FIG. 6J, solder balls 218 are formed in electrical contact with the bottom metallization structure 206B to provide an external interface to the IC dice 204(1)-204(3) and other IC dice 207(1), 207(2) and electrical components 612 in the IC package.

Note that "top" and "bottom" where used herein are relative terms and are not meant to limit or imply a strict orientation that a "top" referenced element must always be oriented to be above a "bottom" referenced element, and vice versa.

IC packages employing an IC die module employing stacked IC dice formed between split, double-sided top and bottom metallization structures to provide die-to-die and external interconnections to the IC dice, including but not limited to the IC packages in FIGS. 2A-3B, and according to the fabrication processes in FIGS. 2A-3B, and according to the fabrication processes in FIGS. 4A and 4B and FIGS. 5A-6J, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 7:
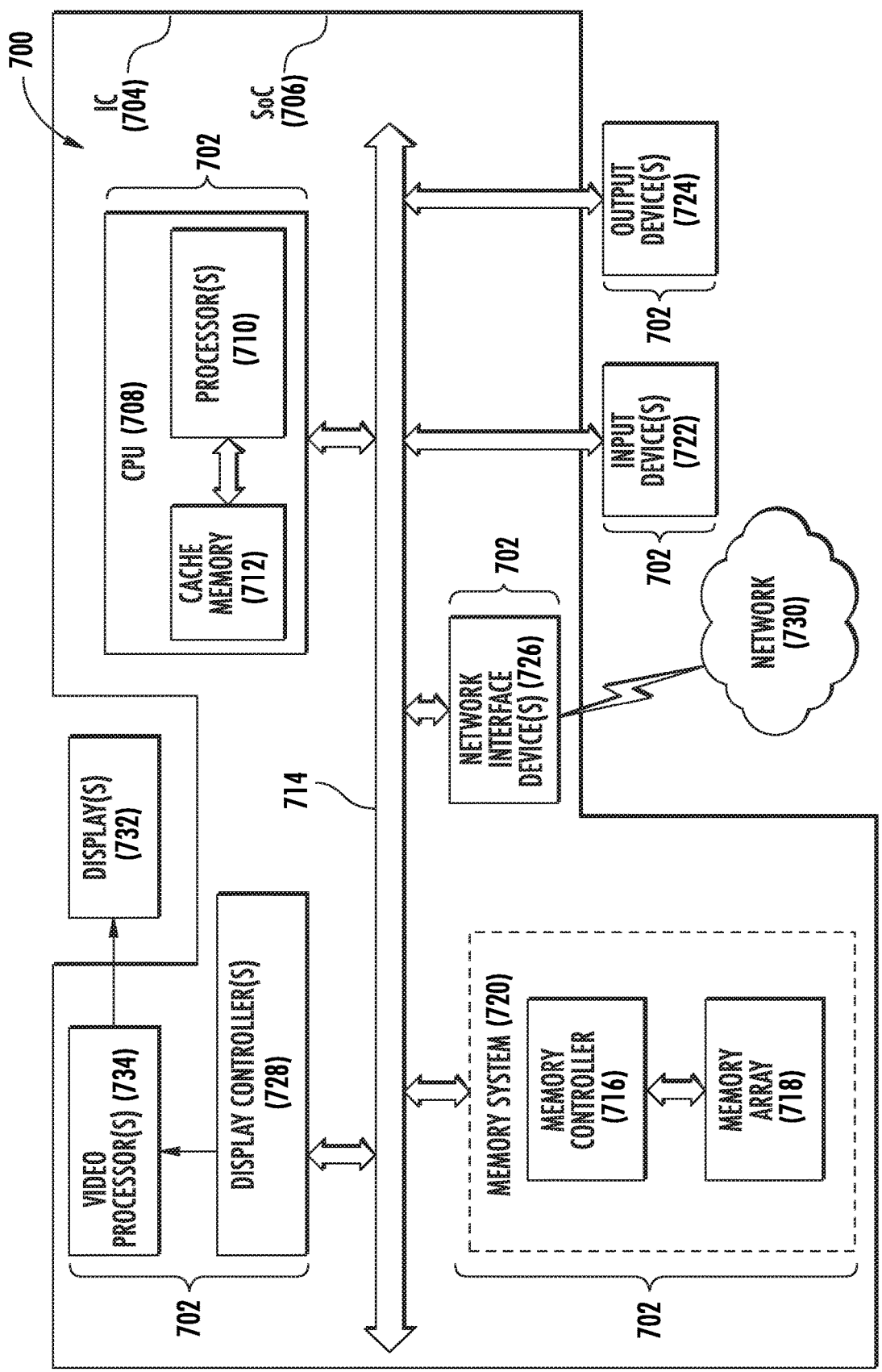
FIG. 7 is a block diagram of an exemplary processor-based system that can be provided in one or more IC packages employing a semiconductor die ("IC die") module employing stacked IC dice formed between split, double-sided top and bottom metallization structures to provide die-to-die and external interconnections to the IC dice, including but not limited to the IC packages in FIGS. 2A-3B, and according to the fabrication processes in FIGS. 4A and 4B and FIGS. 5A-6J.

In this regard, FIG. 7 illustrates an example of a processor-based system 700 including a circuit that can be provided in an IC package 702 employing an IC die module employing stacked IC dice formed between split, double-sided top and bottom metallization structures to provide die-to-die and external interconnections to the IC dice, including but not limited to the IC packages in FIGS. 2A-3B, and according to the fabrication processes in FIGS. 4A and 4B and FIGS. 5A-6J, and according to any aspects disclosed herein. In this example, the processor-based system 700 may be formed as an IC 704 in an IC package 702 and as a system-on-a-chip (SoC) 706. The processor-based system 700 includes a CPU 708 that includes one or more processors 710, which may also be referred to as CPU cores or processor cores. The CPU 708 may have cache memory 712 coupled to the CPU 708 for rapid access to temporarily stored data. The CPU 708 is coupled to a system bus 714 and can intercouple master and slave devices included in the processor-based system 700. As is well known, the CPU 708 communicates with these other devices by exchanging address, control, and data information over the system bus 714. For example, the CPU 708 can communicate bus transaction requests to a memory controller 716 as an example of a slave device. Although not illustrated in FIG. 7, multiple system buses 714 could be provided, wherein each system bus 714 constitutes a different fabric.

Other master and slave devices can be connected to the system bus 714. As illustrated in FIG. 7, these devices can include a memory system 720 that includes the memory controller 716 and a memory array(s) 718, one or more input devices 722, one or more output devices 724, one or more network interface devices 726, and one or more display controllers 728, as examples. Each of the memory system 720, the one or more input devices 722, the one or more output devices 724, the one or more network interface devices 726, and the one or more display controllers 728 can be provided in the same or different IC packages 702. The input device(s) 722 can include any type of input device, including, but not limited to, input keys, switches, voice processors, etc. The output device(s) 724 can include any type of output device, including, but not limited to, audio, video, other visual indicators, etc. The network interface device(s) 726 can be any device configured to allow exchange of data to and from a network 730. The network 730 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 726 can be configured to support any type of communications protocol desired.

The CPU 708 may also be configured to access the display controller(s) 728 over the system bus 714 to control information sent to one or more displays 732. The display controller(s) 728 sends information to the display(s) 732 to be displayed via one or more video processors 734, which process the information to be displayed into a format suitable for the display(s) 732. The display controller(s) 728 and video processor(s) 734 can be included as ICs in the same or different IC packages 702, and in the same or different IC package 702 containing the CPU 708 as an example. The display(s) 732 can include any type of display, including, but not limited to, a cathode ray tube (CRT), a liquid crystal display (LCD), a plasma display, a light emitting diode (LED) display, etc.

Figure 8:
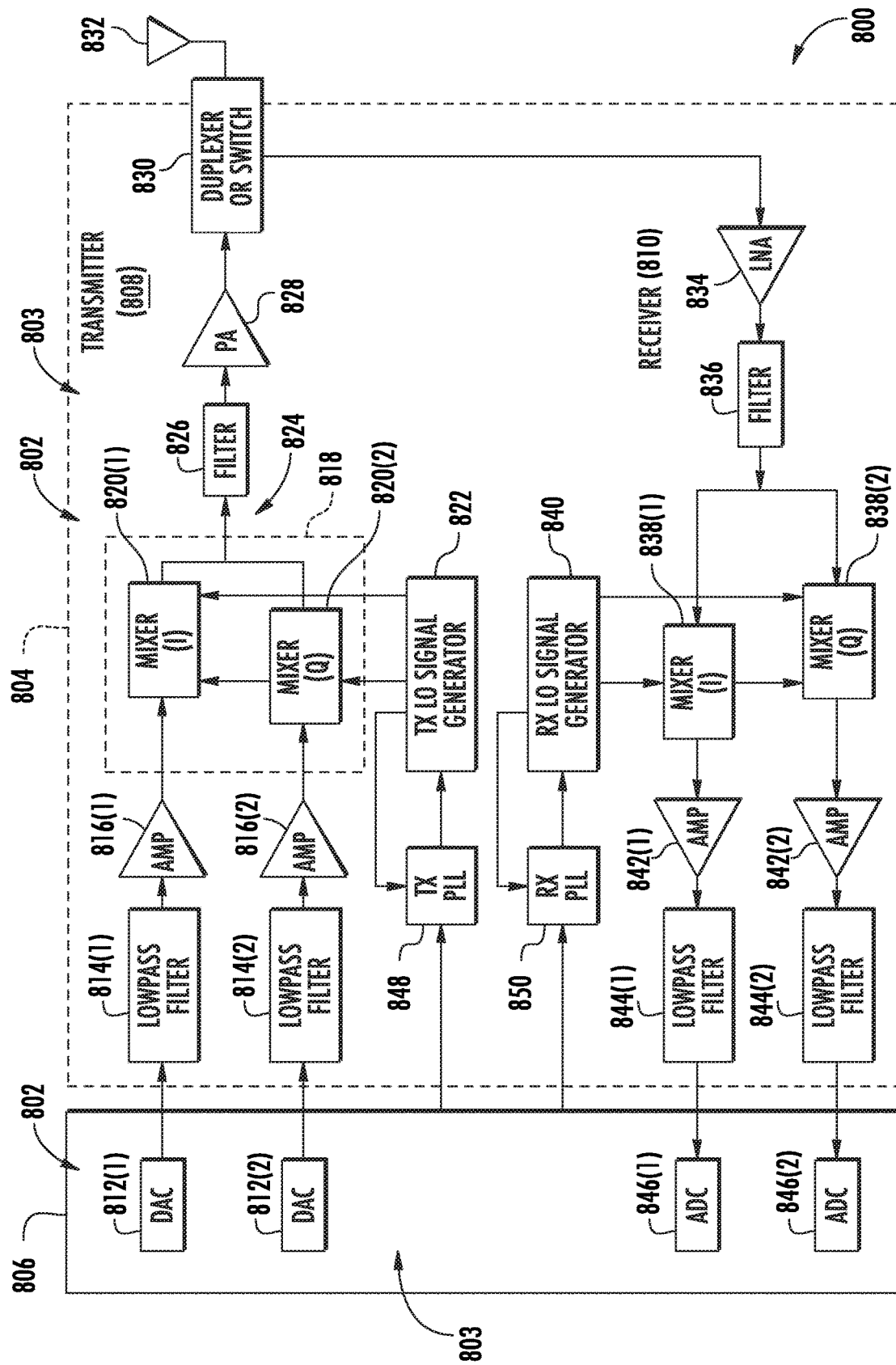
FIG. 8 is a block diagram of an exemplary wireless communications device that includes radio frequency (RF) components provided in one or more IC packages employing a semiconductor die ("IC die") module employing stacked IC dice formed between split, double-sided top and bottom metallization structures to provide die-to-die and external interconnections to the IC dice, including but not limited to the IC packages in FIGS. 2A-3B, and according to the fabrication processes in FIGS. 4A and 4B and FIGS. 5A-6J.

FIG. 8 illustrates an exemplary wireless communications device 800 that includes radio frequency (RF) components formed from one or more ICs 802, wherein any of the ICs 802 can be included in an IC package 803 employing an IC die module employing stacked IC dice formed between split, double-sided top and bottom metallization structures to provide die-to-die and external interconnections to the IC dice, including but not limited to the IC packages in FIGS. 2A-3B, and according to the fabrication processes in FIGS. 4A and 4B and FIGS. 5A-6J, and according to any aspects disclosed herein. The wireless communications device 800 may include or be provided in any of the above referenced devices, as examples. As shown in FIG. 8, the wireless communications device 800 includes a transceiver 804 and a data processor 806. The data processor 806 may include a memory to store data and program codes. The transceiver 804 includes a transmitter 808 and a receiver 810 that support bi-directional communications. In general, the wireless communications device 800 may include any number of transmitters 808 and/or receivers 810 for any number of communication systems and frequency bands. All or a portion of the transceiver 804 may be implemented on one or more analog ICs, RF ICs (RFICs), mixed-signal ICs, etc.

The transmitter 808 or the receiver 810 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 810. In the direct-conversion architecture, a signal is frequency-converted between RF and baseband in one stage. The super-heterodyne and direct-conversion architectures may use different circuit blocks and/or have different requirements. In the wireless communications device 800 in FIG. 8, the transmitter 808 and the receiver 810 are implemented with the direct-conversion architecture.

In the transmit path, the data processor 806 processes data to be transmitted and provides I and Q analog output signals to the transmitter 808. In the exemplary wireless communications device 800, the data processor 806 includes digital-to-analog converters (DACs) 812(1), 812(2) for converting digital signals generated by the data processor 806 into the I and Q analog output signals, e.g., I and Q output currents, for further processing.

Within the transmitter 808, lowpass filters 814(1), 814(2) filter the I and Q analog output signals, respectively, to remove undesired signals caused by the prior digital-to-analog conversion. Amplifiers (AMP) 816(1), 816(2) amplify the signals from the lowpass filters 814(1), 814(2), respectively, and provide I and Q baseband signals. An upconverter 818 upconverts the I and Q baseband signals with I and Q transmit (TX) local oscillator (LO) signals through mixers 820(1), 820(2) from a TX LU signal generator 822 to provide an upconverted signal 824. A filter 826 filters the upconverted signal 824 to remove undesired signals caused by the frequency upconversion as well as noise in a receive frequency band. A power amplifier (PA) 828 amplifies the upconverted signal 824 from the filter 826 to obtain the desired output power level and provides a transmit RF signal. The transmit RF signal is routed through a duplexer or switch 830 and transmitted via an antenna 832.

In the receive path, the antenna 832 receives signals transmitted by base stations and provides a received RF signal, which is routed through the duplexer or switch 830 and provided to a low noise amplifier (LNA) 834. The duplexer or switch 830 is designed to operate with a specific receive (RX)-to-TX duplexer frequency separation, such that RX signals are isolated from TX signals. The received RF signal is amplified by the LNA 834 and filtered by a filter 836 to obtain a desired RF input signal. Downconversion mixers 838(1), 838(2) mix the output of the filter 836 with I and Q RX LO signals (i.e., LO_I and LO_Q) from an RX LO signal generator 840 to generate I and Q baseband signals. The I and Q baseband signals are amplified by amplifiers (AMP) 842(1), 842(2) and further filtered by lowpass filters 844(1), 844(2) to obtain I and Q analog input signals, which are provided to the data processor 806. In this example, the data processor 806 includes ADCs 846(1), 846(2) for converting the analog input signals into digital signals to be further processed by the data processor 806.

In the wireless communications device 800 of FIG. 8, the TX LO signal generator 822 generates the I and Q TX LO signals used for frequency upconversion, while the RX LO signal generator 840 generates the I and Q RX LO signals used for frequency downconversion. Each LO signal is a periodic signal with a particular fundamental frequency. A TX phase-locked loop (PLL) circuit 848 receives timing information from the data processor 806 and generates a control signal used to adjust the frequency and/or phase of the TX LO signals from the TX LO signal generator 822. Similarly, an RX PLL circuit 850 receives timing information from the data processor 806 and generates a control signal used to adjust the frequency and/or phase of the RX LO signals from the RX LO signal generator 840.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

What is claimed is:

1. An integrated circuit (IC) package, comprising:
    a first metallization structure comprising at least one first interconnect layer;
    a second metallization structure comprising at least one second interconnect layer; and
    an IC die module disposed between the first metallization structure and the second metallization structure, the IC die module comprising:
        a first IC die comprising a first active surface and a first non-active surface;
        a second IC die comprising a second active surface and a second non-active surface; and
        a compression bond between the first non-active surface of the first IC die and the second non-active surface of the second IC die coupling the first non-active surface of the first IC die to the second non-active surface of the second IC die;
        the first active surface of the first IC die is electrically coupled to a first interconnect layer of the at least one first interconnect layer of the first metallization structure; and
        the second active surface of the second IC die is electrically coupled to a second interconnect layer of the at least one second interconnect layer of the second metallization structure.

2. The IC package of claim 1, wherein:
    the first metallization structure is disposed in a first horizontal plane;
    the second metallization structure is disposed in a second horizontal plane parallel to the first horizontal plane;
    the first IC die is disposed in a third horizontal plane parallel to the first horizontal plane; and
    the second IC die is disposed in the second horizontal plane parallel to the first horizontal plane.

3. The IC package of claim 1, wherein:
    the first metallization structure comprises a first redistribution layer (RDL) structure; and
    the second metallization structure comprises a second RDL structure.

4. The IC package of claim 1, wherein:
    the first metallization structure comprises a first package substrate; and
    the second metallization structure comprises a second package substrate.

5. The IC package of claim 1, wherein:
    the first active surface of the first IC die comprises a first bottom, active surface;
    the first non-active surface of the first IC die comprises a first top, non-active surface;
    the second active surface of the second IC die comprises a second bottom, active surface; and
    the second non-active surface of the second IC die comprises a second top, non-active surface.

6. The IC package of claim 1, wherein:
    the first IC die further comprises at least one first die interconnect exposed at the first active surface;
    the second IC die further comprises at least one second die interconnect exposed at the second active surface; and
    further comprising:
        a first compression bond between the at least one first die interconnect and the first metallization structure electrically coupling the at least one first die interconnect to the at least one first interconnect layer; and
        a second compression bond between the at least one second die interconnect and the second metallization structure coupling the at least one second die interconnect to the at least one second interconnect layer.

7. The IC package of claim 6, wherein:
    the first metallization structure further comprises at least one first substrate interconnect electrically coupled to the at least one first interconnect layer;
    the second metallization structure further comprises at least one second substrate interconnect electrically coupled to the at least one second interconnect layer;
    the at least one first die interconnect is electrically coupled to the at least one first substrate interconnect to electrically couple the at least one first die interconnect to the at least one first interconnect layer; and
    the at least one second die interconnect is electrically coupled to the at least one second substrate interconnect to electrically couple the at least one second die interconnect to the at least one second interconnect layer.

8. The IC package of claim 2, wherein:
    a height between a first outer surface of the first metallization structure and a first inside surface of the first metallization structure in a height axis direction perpendicular to the first horizontal plane is between fifteen (15) micrometers (μm) and 150 μm; and
    a second height between a second outer surface of the second metallization structure and a second inside surface of the second metallization structure in the height axis direction perpendicular to the first horizontal plane is between fifteen (15) μm and 150 μm.

9. The IC package of claim 8, wherein a third height of the IC die module between a first inside surface of the first metallization structure and a second inside surface of the second metallization structure in the height axis direction perpendicular to the first horizontal plane is between 100 μm and 600 μm.

10. The IC package of claim 1, wherein:
the IC die module further comprises a third IC die comprising a third active surface and a third non-active surface;
a compression bond between the third non-active surface of the third IC die and the first non-active surface of the first IC die coupling the third non-active surface of the first IC die to the first non-active surface of the first IC die; and
the third active surface of the third IC die is electrically coupled to the at least one second interconnect layer of the second metallization structure.

11. The IC package of claim 10, wherein:
the third IC die further comprises at least one third die interconnect exposed at the third active surface; and further comprising:
a third compression bond between the at least one third die interconnect and the second metallization structure electrically coupling the at least one third die interconnect to the at least one second interconnect layer.

12. The IC package of claim 1, wherein the IC die module further comprises at least one passive electrical device disposed adjacent to the first IC die and the second IC die;
the at least one passive electrical device electrically coupled to a first interconnect layer of the at least one first interconnect layer of the first metallization structure, and a second interconnect layer of the at least one second interconnect layer of the second metallization structure.

13. The IC package of claim 1, wherein the IC die module further comprises at least one vertical interconnect access (via) disposed adjacent to the first IC die and the second IC die;
the at least one via electrically coupled to at least one first interconnect layer of the first metallization structure, and at least one second interconnect layer of the second metallization structure.

14. The IC package of claim 1, further comprising at least one solder bump electrically coupled to at least one first interconnect layer of the first metallization structure.

15. The IC package of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

16. A method of fabricating an integrated circuit (IC) package, comprising:
fabricating a first metallization structure comprising at least one first interconnect layer;
fabricating a second metallization structure comprising at least one second interconnect layer;
fabricating an IC die module disposed between the first metallization structure and the second metallization structure, comprising:
providing a first IC die comprising a first active surface and a first non-active surface;
providing a second IC die comprising a second active surface and a second non-active surface; and
compression bonding the first non-active surface of the first IC die to the second non-active surface of the second IC die to couple the first IC die to the second IC die;
electrically coupling the first active surface of the first IC die to a first interconnect layer of the at least one first interconnect layer of the first metallization structure; and
electrically coupling the second active surface of the second IC die to a second interconnect layer of the at least one second interconnect layer of the second metallization structure.

17. The method of claim 16, wherein compression bonding the first non-active surface of the first IC die to the second non-active surface of the second IC die comprises:
disposing a first oxide layer on the first non-active surface of the first IC die;
disposing a second oxide layer on the second non-active surface of the second IC die; and
compressing the first oxide layer on the first non-active surface to the second oxide layer on the second non-active surface.

18. The method of claim 17, wherein compression bonding the first non-active surface to the second non-active surface further comprises, before compressing the first oxide layer on the first non-active surface to the second oxide layer on the second non-active surface:
raising a temperature of the first oxide layer to between 150-180 degrees Celsius; and
raising a temperature of the second oxide layer to between 150-180 degrees Celsius.

19. The method of claim 16, wherein compression bonding the first non-active surface to the second non-active surface comprises:
forming a first temporary bonding film on the first active surface of the first IC die;
mounting a first carrier on the first temporary bonding film;
forming a second temporary bonding film on the second active surface of the second IC die;
mounting a second carrier on the second temporary bonding film; and
compressing the first non-active surface of the first IC die to the second non-active surface of the second IC die.

20. The method of claim 16, wherein:
electrically coupling the first active surface of the first IC die to the first interconnect layer of the at least one first interconnect layer of the first metallization structure further comprises compression bonding the first active surface of the first IC die to the first metallization structure; and
electrically coupling the second active surface of the first IC die to the second interconnect layer of the at least one second interconnect layer of the first metallization structure further comprises compression bonding the second active surface of the second IC die to the second metallization structure.

21. The method of claim 20, further comprising:
before compression bonding the first active surface of the first IC die to the first metallization structure:
raising a temperature of the first metallization structure to between 150-180 degrees Celsius; and
before compression bonding the second active surface of the second IC die to the second metallization structure:

raising a temperature of the second metallization structure to between 150-180 degrees Celsius.

22. The method of claim 16, wherein fabricating the IC die module further comprises disposing an electrical component on the first metallization structure adjacent to the first IC die.

23. The method of claim 16, wherein fabricating the IC die module further comprises disposing a mold material over the first IC die and the second IC die.

24. The method of claim 22, further comprising forming one or more solder balls in electrical contact with the at least one first interconnect layer of the first metallization structure.

* * * * *